US010510556B2

(12) United States Patent
Chen et al.

(10) Patent No.: US 10,510,556 B2
(45) Date of Patent: *Dec. 17, 2019

(54) INTEGRATED CIRCUIT PACKAGE PAD AND METHODS OF FORMING

(71) Applicant: Taiwan Semiconductor Manufacturing Company, Ltd., Hsinchu (TW)

(72) Inventors: Hsien-Wei Chen, Hsinchu (TW); Chen-Hua Yu, Hsinchu (TW); Chi-Hsi Wu, Hsinchu (TW); Der-Chyang Yeh, Hsinchu (TW); An-Jhih Su, Taoyuan (TW); Wei-Yu Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,864

(22) Filed: May 6, 2019

(65) Prior Publication Data

US 2019/0259630 A1 Aug. 22, 2019

Related U.S. Application Data

(60) Continuation of application No. 15/805,683, filed on Nov. 7, 2017, now Pat. No. 10,283,375, which is a
(Continued)

(51) Int. Cl.
*H01L 21/48* (2006.01)
*H01L 21/56* (2006.01)
(Continued)

(52) U.S. Cl.
CPC ........ *H01L 21/4846* (2013.01); *H01L 21/486* (2013.01); *H01L 21/565* (2013.01);
(Continued)

(58) Field of Classification Search
CPC ............ H01L 23/3128; H01L 23/3185; H01L 23/498; H01L 23/49838; H01L 25/50; H01L 25/105
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

CN 101996896 A 3/2011
KR 1020140035804 A 3/2014
(Continued)

*Primary Examiner* — Peniel M Gumedzoe
(74) *Attorney, Agent, or Firm* — Slater Matsil, LLP

(57) ABSTRACT

A semiconductor device and method for forming the semiconductor device is provided. The semiconductor device includes an integrated circuit having through vias adjacent to the integrated circuit die, wherein a molding compound is interposed between the integrated circuit die and the through vias. The through vias have a projection extending through a patterned layer, and the through vias may be offset from a surface of the patterned layer. The recess may be formed by selectively removing a seed layer used to form the through vias.

20 Claims, 40 Drawing Sheets

Related U.S. Application Data division of application No. 14/743,451, filed on Jun. 18, 2015, now Pat. No. 9,812,337.

(60) Provisional application No. 62/087,090, filed on Dec. 3, 2014.

(51) Int. Cl.

| | | |
|---|---|---|
| *H01L 23/31* | (2006.01) | |
| *H01L 23/498* | (2006.01) | |
| *H01L 25/00* | (2006.01) | |
| *H01L 23/00* | (2006.01) | |
| *H01L 25/10* | (2006.01) | |
| *H01L 25/065* | (2006.01) | |
| *H01L 23/538* | (2006.01) | |

(52) U.S. Cl.
CPC ........ *H01L 21/568* (2013.01); *H01L 23/3128* (2013.01); *H01L 23/3185* (2013.01); *H01L 23/498* (2013.01); *H01L 23/49838* (2013.01); *H01L 24/19* (2013.01); *H01L 24/20* (2013.01); *H01L 25/105* (2013.01); *H01L 25/50* (2013.01); *H01L 23/49827* (2013.01); *H01L 23/5389* (2013.01); *H01L 25/0657* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/00* (2013.01); *H01L 2924/00012* (2013.01); *H01L 2924/00014* (2013.01); *H01L 2924/15311* (2013.01); *H01L 2924/181* (2013.01); *H01L 2924/18162* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2007/0181989 A1 | 8/2007 | Corisis et al. |
| 2010/0140779 A1 | 6/2010 | Lin et al. |
| 2010/0237495 A1 | 9/2010 | Pagaila et al. |
| 2011/0045634 A1 | 2/2011 | Pagaila |
| 2011/0140259 A1 | 6/2011 | Cho et al. |
| 2011/0180935 A1* | 7/2011 | Choi ................... H01L 23/3121 257/774 |
| 2011/0204505 A1 | 8/2011 | Pagaila et al. |
| 2011/0278736 A1 | 11/2011 | Lin et al. |
| 2011/0291288 A1 | 12/2011 | Wu et al. |
| 2012/0217645 A1 | 8/2012 | Pagaila |
| 2012/0280386 A1 | 11/2012 | Sato et al. |
| 2012/0306097 A1 | 12/2012 | Kim et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0256875 A1 | 10/2013 | Chen et al. |
| 2013/0267063 A1 | 10/2013 | Beer et al. |
| 2013/0307140 A1 | 11/2013 | Huang et al. |
| 2014/0070403 A1 | 3/2014 | Pan et al. |
| 2014/0077363 A1 | 3/2014 | Lin et al. |
| 2014/0131858 A1 | 5/2014 | Pan et al. |
| 2014/0159251 A1 | 6/2014 | Marimuthu et al. |
| 2014/0183731 A1 | 7/2014 | Lin et al. |
| 2014/0203429 A1 | 7/2014 | Yu et al. |
| 2014/0210101 A1 | 7/2014 | Lin et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0179591 A1 | 6/2015 | Tsai et al. |

FOREIGN PATENT DOCUMENTS

| | | |
|---|---|---|
| KR | 1020140086812 A | 7/2014 |
| TW | 201041058 A | 11/2010 |
| TW | 201423851 A | 6/2014 |

\* cited by examiner 10,510,556 B2

INTEGRATED CIRCUIT PACKAGE PAD AND METHODS OF FORMING

This application is a continuation of U.S. application Ser. No. 15/805,683, filed on Nov. 7, 2017, entitled "Integrated Circuit Package Pad and Methods of Forming," which is a divisional of U.S. application Ser. No. 14/743,451, filed on Jun. 18, 2015, now U.S. Pat. No. 9,812,337 issued Nov. 7, 2017, entitled "Integrated Circuit Package Pad and Methods of Forming," which claims the benefit of U.S. Provisional Application No. 62/087,090, filed on Dec. 3, 2014, entitled "Integrated Circuit Package Pad and Methods of Forming Same," each application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
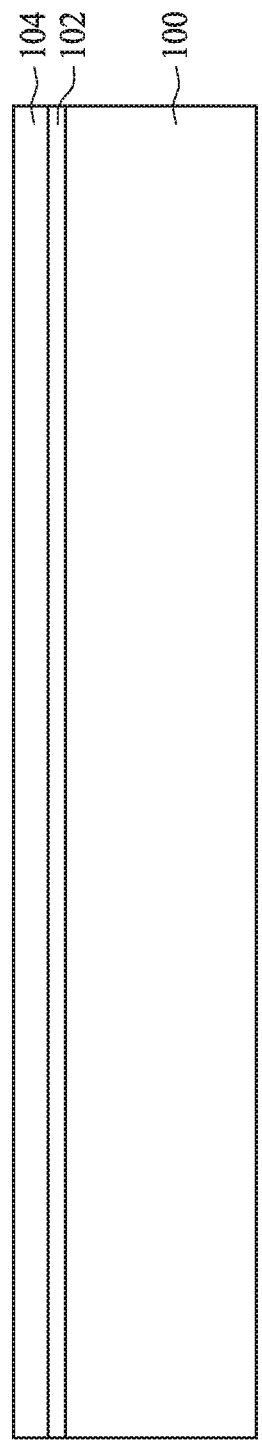
FIGS. 1-9 are cross-sectional views of various intermediate steps of forming semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a three dimensional (3D) integrated fan-out (InFO) package-on-package (PoP) device. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1-9 illustrate cross-sectional views of intermediate steps in forming a semiconductor package in accordance with some embodiments. Referring first to FIG. 1, there is shown a carrier substrate 100 having a release layer 102 and a backside dielectric layer 104 formed thereon. Generally, the carrier substrate 100 provides temporary mechanical and structural support during subsequent processing steps. The carrier substrate 102 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 100 is planar in order to accommodate further processing.

The release layer 102 is an optional layer formed over the carrier substrate 100 that may allow easier removal of the carrier substrate 100. As explained in greater detail below, various layers and devices will be placed over the carrier substrate 100, after which the carrier substrate 100 may be removed. The optional release layer 102 aids in the removal of the carrier substrate 100, reducing damage to the structures formed over the carrier substrate 100. The release layer 102 may be formed of a polymer-based material. In some embodiments, the release layer 102 is an epoxy-based thermal release material, which loses its adhesive property when heated, such as a Light-to-Heat-Conversion (LTHC) release coating. In other embodiments, the release layer 102 may be an ultra-violet (UV) glue, which loses its adhesive property when exposed to UV light. The release layer 102 may be dispensed as a liquid and cured. In other embodiments, the release layer 102 may be a laminate film laminated onto the carrier substrate 102. Other release layers may be utilized.

The backside dielectric layer 104 may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped Phospho-Silicate Glass (BPSG), or a combination thereof, or the like), or the like, and may be formed, for example, by spin coating, lamination, Chemical Vapor Deposition (CVD), or the like. In some embodiments, the backside dielectric layer 104 has a thickness of about 1 μm to about 10 μm, such as about 7 μm.

Figure 2:
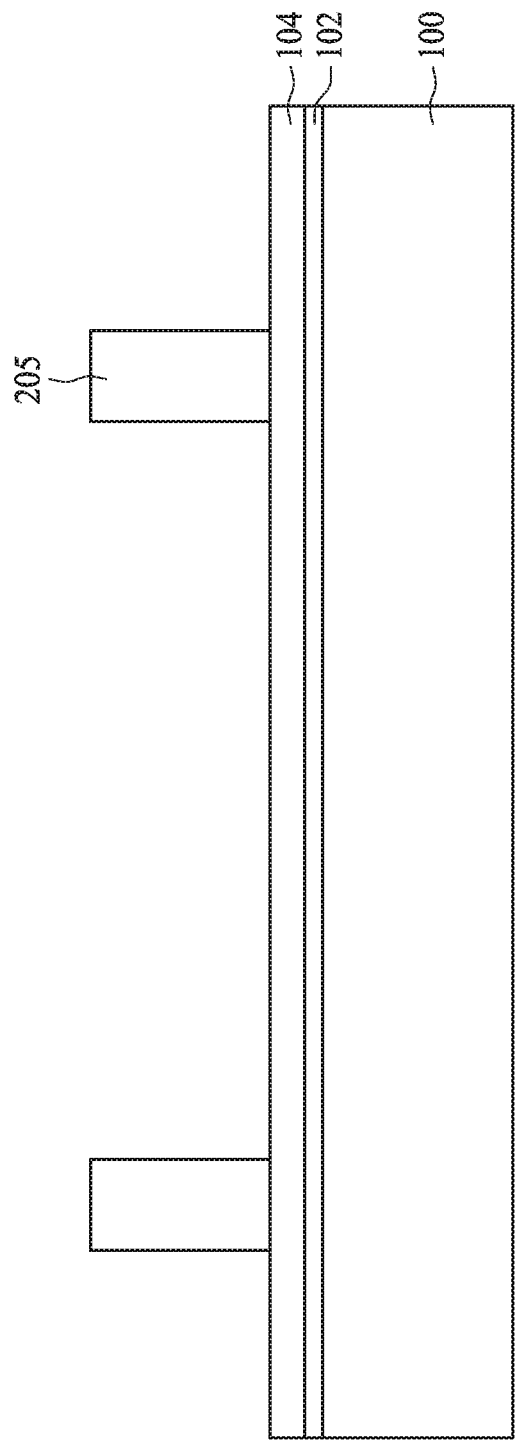

Referring now to FIG. 2, there is shown formation of conductive structures 205 in accordance with some embodiments. The conductive structures 205 provide an electrical connection from one side of the package to another side of the package. For example, as will be explained in greater detail below, a die will be mounted to the backside dielectric layer 104 and a molding compound will be formed around the conductive structures and the die, thereby forming through vias. Subsequently, another device, such as another die, package, substrate, or the like, may be attached to the die and the molding compound. The conductive structures 205 provide an electrical connection between the another device and the backside of the package without having to pass electrical signals through the die mounted to the backside dielectric layer 104.

The conductive structures 205, for example, by forming a conductive seed layer (not shown) over the backside dielectric layer 104. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like. The seed layer may comprise one or more layers.

A mask, such as a patterned photoresist layer, may be deposited and patterned to define the shape of the conductive structures 205, wherein openings in the mask expose the seed layer. The openings may be filled with a conductive material using, for example, an electroless plating process or an electrochemical plating process. The plating process may uni-directionally fill openings (e.g., from seed layer upwards) in the patterned photoresist. Uni-directional filling may allow for more uniform filling of such openings, particularly for high aspect ratio through vias. Alternatively, a seed layer may be formed on sidewalls of openings in the patterned photoresist, and such openings may be filled multi-directionally. Subsequently, the photoresist may be removed in an ashing and/or wet strip process, and excess materials of the seed layer may be etched, leaving the conductive structures 205 over the backside dielectric layer 104 as illustrated in FIG. 2. The conductive structures 205 can also be realized with metal wire studs placed by a wire bonding process, such as a copper wire bonding process. The use of a wire bonding process may eliminate the need for depositing a seed layer, depositing and patterning a photoresist, and plating to form the conductive structures 205.

Figure 3:
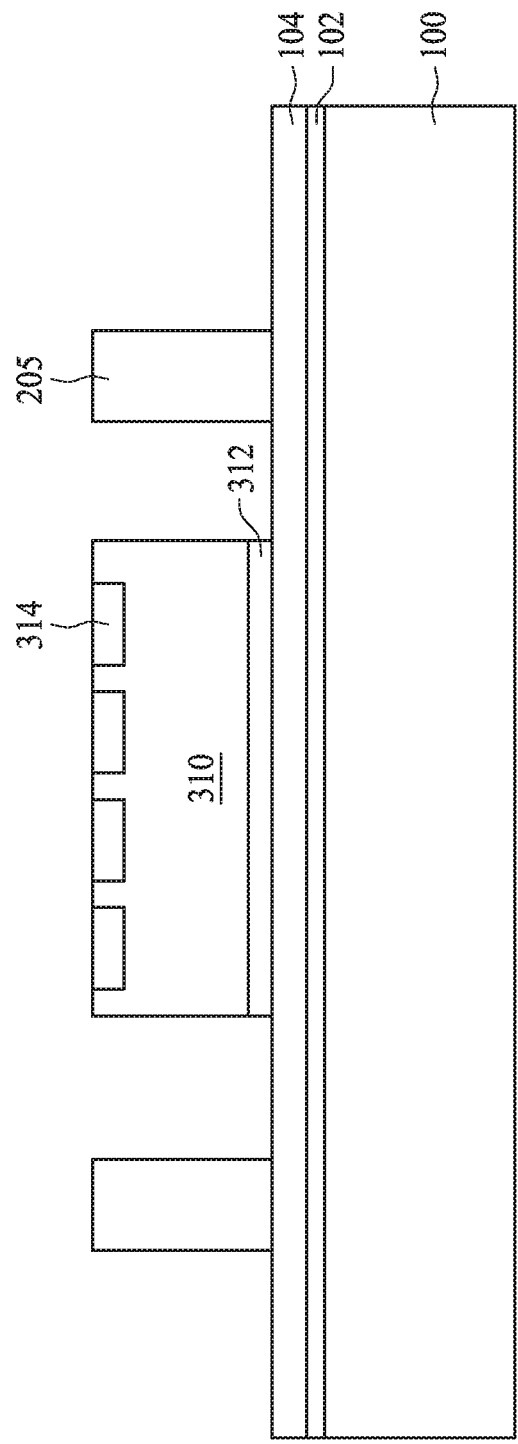

FIG. 3 illustrates attaching an integrated circuit die 310 to the backside dielectric layer 104 in accordance with some embodiments. In some embodiments, the integrated circuit die 310 may be adhered to the backside dielectric layer 104 by an adhesive 312, such as a die-attach film (DAF). A thickness of the adhesive 312 may be in a range from about 10 μm to about 30 μm. The integrated circuit die 310 may be a single die as illustrated in FIG. 3, or in some embodiments, two or more than two dies may be attached, and may include any die suitable for a particular approach. For example, the integrated circuit die 310 may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. The integrated circuit die 310 may be attached to a suitable location for a particular design or application. For example, FIG. 3 illustrates an embodiment in which the integrated circuit die 310 is mounted in a center region wherein the conductive structures 205 are positioned around a perimeter. In other embodiments, the integrated circuit die 310 may be offset from a center. Before being attached to the backside dielectric layer 104, the integrated circuit die 310 may be processed according to applicable manufacturing processes to form integrated circuits in the integrated circuit die 310.

In some embodiments, the integrated circuit die 310 is mounted to the backside dielectric layer 104 such that die contacts 314 are facing away from or distal to the backside dielectric layer 104. The die contacts 314 provide an electrical connection to the electrical circuitry formed on the integrated circuit die 310. The die contacts 314 may be formed on an active side of the integrated circuit die 310, or may be formed on a backside and comprise through vias. The die contacts 314 may further comprise through vias providing an electrical connection between a first side and a second side of the integrated circuit die 310. In an embodiment, the conductive material of the die contacts 314 is copper, tungsten, aluminum, silver, gold, tin, a combination thereof, or the like.

Figure 4:
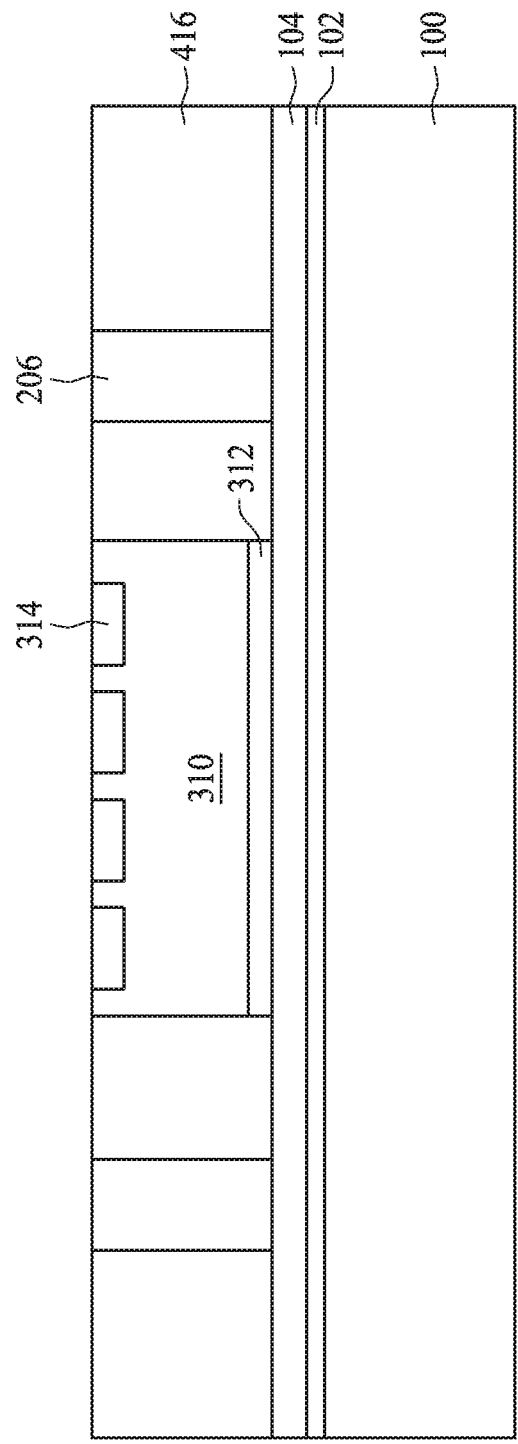

FIG. 4 illustrates encapsulating the integrated circuit die 310 and the conductive structures 205 by an encapsulant 416, thereby forming through vias 206, in accordance with some embodiments. In some embodiments, the encapsulating process is a wafer-level molding process. For example, encapsulant 416 is dispensed to fill gaps between the integrated circuit die 310 and the through vias 206. The encapsulant 416 may include any suitable material such as a molding compound, an epoxy resin, a polymer, a molding underfill, or the like. Suitable methods for forming the encapsulant 416 may include compressive molding, transfer molding, liquid encapsulant molding, or the like. For example, the encapsulant 416 may be dispensed between the integrated circuit die 310 and the conductive structures 205 in liquid form. Subsequently, a curing process is performed to solidify the encapsulant 416.

In some embodiments, the encapsulant 416 is formed to cover the through vias 206 and/or the die contacts 314. In these embodiments, a mechanical grinding, chemical mechanical polish (CMP), or other etch back technique may be employed to remove excess portions of the encapsulant 416 and expose the die contacts 314 of the integrated circuit die 310. After planarization, top surfaces of the encapsulant 416, the integrated circuit die 310, and the through vias 206 may be substantially level.

Figure 5:
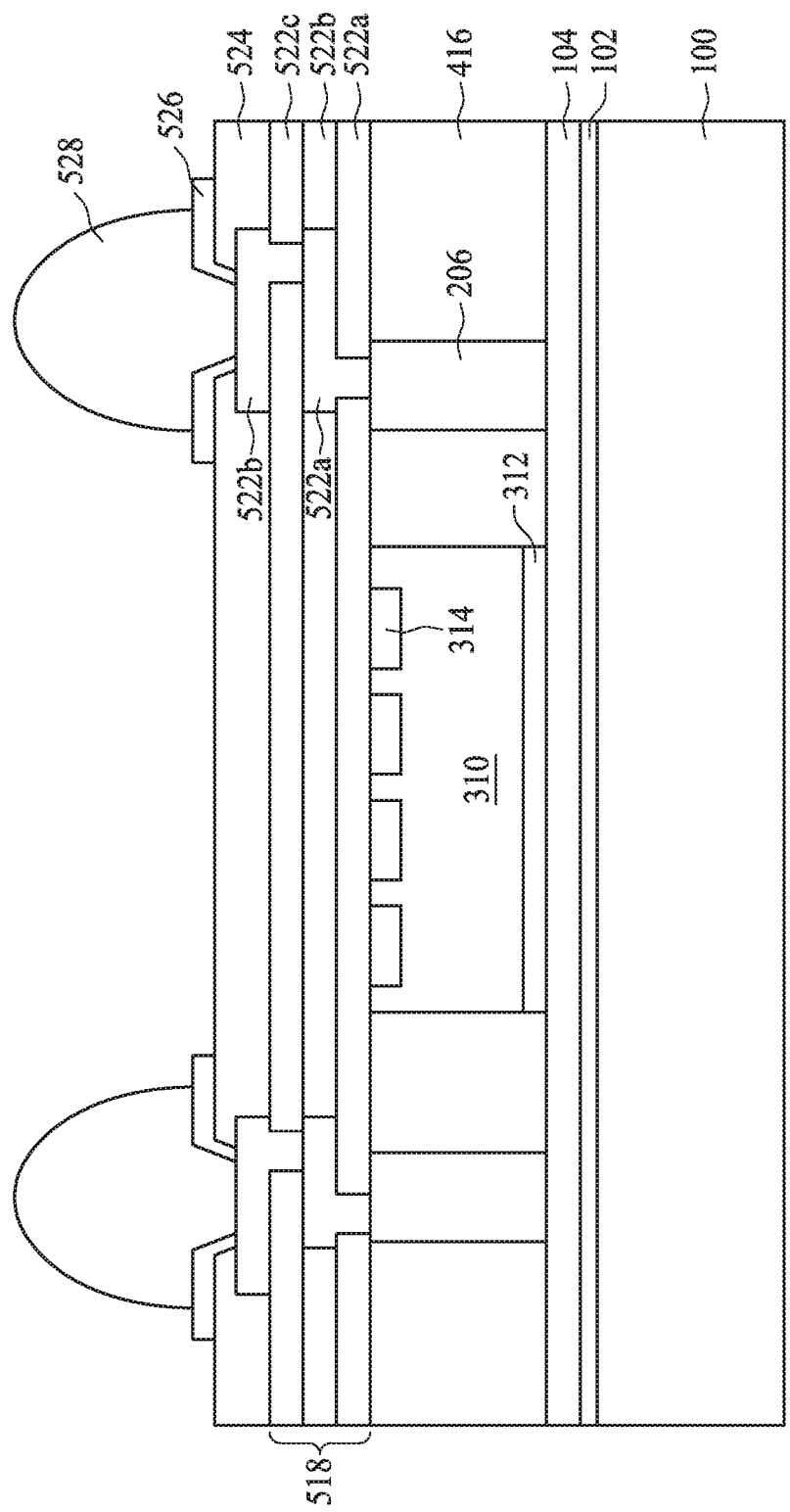

FIG. 5 illustrates formation of a front-side redistribution structure 518 in accordance with some embodiments. Generally, the front-side redistribution structure 518 comprises one or more redistribution layers (RDLs) and provides a conductive pattern to be formed to allow a pin-out contact pattern for a completed package different than the pattern of the through vias 206 and the die contacts 314, allowing for greater flexibility in the placement of the through vias 206 and the integrated circuit die 310. The RDLs may be utilized to provide an external electrical connection to the integrated circuit die 310 and/or to the through vias 206. The RDLs may further be used to electrically couple the integrated circuit die 310 to the through vias 206, which may be electrically coupled to one or more other packages, package substrates, components, the like, or a combination thereof. The numbers of illustrated metallization layers in the front-side redistribution structure 518 are only for illustrative purposes and are not limiting. The front-side redistribution structure 518 may comprise any number of dielectric layers, metallization patterns, and vias. For example, FIG. 5 illustrates an embodiment in which the redistribution structure 518 includes three dielectric layers 520a, 520b, and 520c, collectively referred to as the front-side dielectric layers 520, with respective metallization patterns and vias, as will be discussed below, although other embodiments may have fewer or more.

The first dielectric layer 520a is formed on the encapsulant 416 and integrated circuit die 310. In some embodiments, the first dielectric layer 520a is formed of a polymer, which may be a photo-sensitive material such as polybenzoxazole (PBO), polyimide, benzocyclobutene (BCB), or the like, that may be patterned using lithography. In other embodiments, the first dielectric layer 520a is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer 520a may be formed by spin coating, lamination, CVD, the like, or a combination thereof. The first dielectric layer 520a is then patterned to form openings to expose portions of the die contacts 314 and the through vias 206. In embodiments in which the first dielectric layer 520a is formed of a photo-sensitive material, the patterning may be performed by exposing the first dielectric layer 520a in accordance with a desired pattern and developed to remove the unwanted material, thereby exposing portions of the die contacts 314 and the through vias 206. Other methods, such as using a patterned mask and etching, may also be used to pattern the first dielectric layer 520a.

A first metallization pattern 522a is formed on the first dielectric layer 520a and is in electrical contact with the exposed die contacts 314 and through vias 206. As an example to form first metallization pattern 522a, a seed layer (not shown) is formed over the first dielectric layer 522a and in the openings formed in the first dielectric layer 522a. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern. In some embodiments, the mask is a photoresist formed by spin coating or the like and exposed to light for patterning. The pattern of the mask corresponds to the first metallization pattern 522a. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the first metallization pattern 522a. The second dielectric layer 520b is formed over the first dielectric layer 522a to provide a more planar surface for subsequent layers and may be formed using similar materials and processes as used to form the first dielectric layer 520a. In some embodiments, the second dielectric layer 520b is formed of polymer, a nitride, an oxide, or the like. In some embodiments, the second dielectric layer 520b is PBO formed by a spin-on process.

A third dielectric layer 522c and a second metallization pattern 522b is formed on the second dielectric layer 520b and first metallization pattern 522a. The third dielectric layer 522c and the second metallization pattern 522b can be formed using similar processes with similar materials as used for forming the first dielectric layer 520a and the first metallization pattern 522a as discussed above. The openings in the front-side dielectric layers 520 form vias that interconnect adjacent metallization layers, such as interconnecting the first metallization pattern 522a and the through vias 206/die contacts 314, and interconnecting the first metallization pattern 522a and the second metallization patter 522b.

FIG. 5 further illustrates a passivation layer 524 formed over an uppermost metallization pattern in accordance with some embodiments. The passivation layer 524 may be formed of a polymer, which may be a photo-sensitive material such as PBO, polyimide, BCB, or the like, that may be patterned using a lithography mask. In other embodiments, the passivation layer 524 is formed of a nitride or an oxide such as silicon nitride, silicon oxide, PSG, BSG, BPSG, or the like. The passivation layer 524 may be formed by spin coating, lamination, CVD, the like, or a combination thereof. The passivation layer 524 is then patterned to expose portions of the underlying metallization layer, e.g., the second metallization pattern 522b. The patterning may be by an acceptable process, such as by exposing the passivation layer 524 to light when the dielectric layer is a photo-sensitive material or by etching using, for example, an anisotropic etch. A single passivation layer 524 is shown for illustrative purposes, and in other embodiments, a plurality of passivation layers may be used.

FIG. 5 also illustrates an under bump metallization (UBM) 526 formed and patterned over and through the passivation layer 524, thereby forming an electrical connection with an uppermost metallization layer, e.g., the second metallization layer 522b in the embodiment illustrated in FIG. 5. The under bump metallization 526 provides an electrical connection upon which an electrical connector, e.g., a solder ball/bump, a conductive pillar, or the like, may be placed. In an embodiment, the under bump metallization 526 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 526 is formed using sputtering. In other embodiments, electro plating may be used.

Connectors 528 are formed over the under bump metallization 526 in accordance with some embodiments. The connectors 528 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 528 may include a conductive material such as solder, copper, aluminum, gold, nickel, silver, palladium, tin, the like, or a combination thereof. In some embodiments, the connectors 528 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 528 may form a grid, such as a ball grid array (BGA). In some embodiments, a reflow process may be performed, giving the connectors 528 a shape of a partial sphere in some embodiments. Alternatively, the connectors 528 may comprise other shapes. The connectors 528 may also comprise non-spherical conductive connectors, for example.

In some embodiments, the connectors 528 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

The front-side redistribution structure 518 is simplified for purposes of illustration. For example, for purposes of illustration, conductive lines have been illustrated extending only from the through vias 206, although the front-side redistribution structure 518 may be used to provide an external electrical connection to any of the through vias 206 and the die contacts 314, as well as coupling respective ones of the through vias 206 to respective ones of the die contacts 314.

Figure 6:
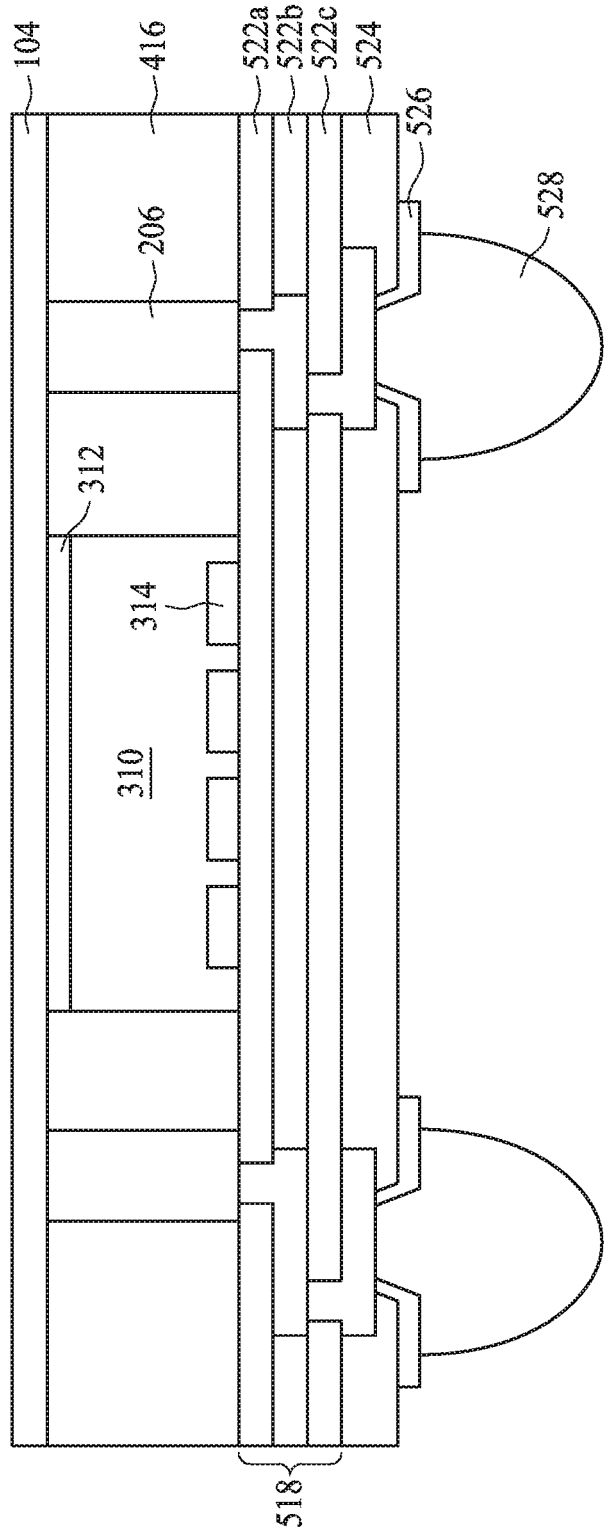

FIG. 6 illustrates removing the carrier substrate 100 and the release layer 102 (see FIG. 5) to expose the backside dielectric layer 104 in accordance with some embodiments. In some embodiments, the de-bonding includes projecting a light such as a laser light or an UV light on the release layer 102 so that the release layer 102 decomposes under the heat of the light and the carrier substrate 100 can be removed. In another embodiment, a thermal process, a chemical strip process, laser removal, a UV treatment, the like, or a combination thereof may be used.

After separating the carrier substrate 100, a cleaning process may be used to remove the residue of the release layer 102. In embodiments in which an LTHC film is used as the release layer 102, a plasma clean process may be used to remove the LTHC residue. For example, in some embodiments a plasma cleaning process using Ar, $N_2$, $CF_4$, $O_2$, or the like as process gases. After the de-bonding of the carrier substrate 100 and the release layer 102, the backside dielectric layer 104 is exposed.

In some embodiments, additional support may be desired. In these situations, a second carrier substrate (not shown) may be attached to the passivation layer 524 and/or the connectors 528 prior to removing the carrier substrate 100. The second carrier substrate may be attached using, for example, an adhesive, such as a UV adhesive.

Figure 7:
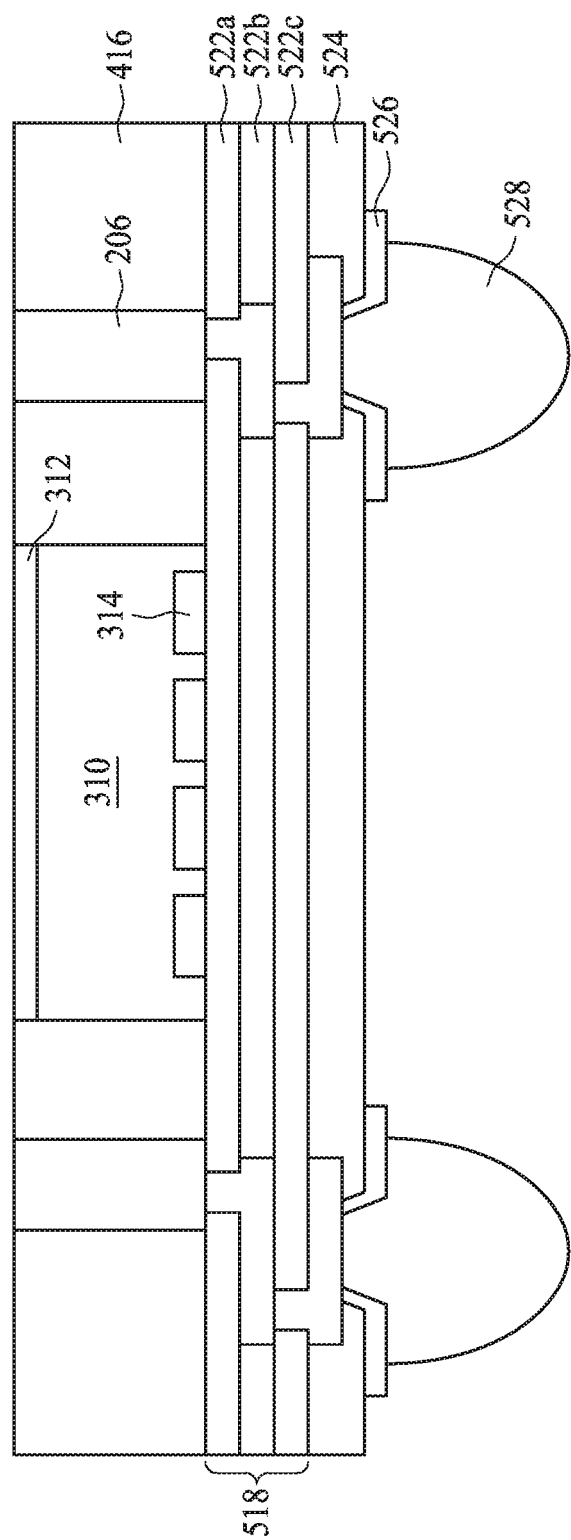

FIG. 7 illustrates removing the backside dielectric layer 104 in accordance with some embodiments. Generally, if electrical contact is to be made to the through vias 206 and/or the integrated circuit die 310 (such as the case in which the integrated circuit die orientation is reversed or the integrated circuit die includes through vias), then at least a portion of the backside dielectric layer 104 is removed. It has been found that laser drilling openings through the backside dielectric layer 104 may damage the through vias as well as include many additional process steps. In accordance with some embodiments disclosed herein, a laser drilling process is not necessary to expose the through vias 206, thereby reducing and/or preventing unnecessary damage.

In some embodiments, the backside dielectric layer 104 is removed using a dry etch process using, for example, Ar, $N_2$, $CF_4$, $O_2$, or the like.

Figure 8:
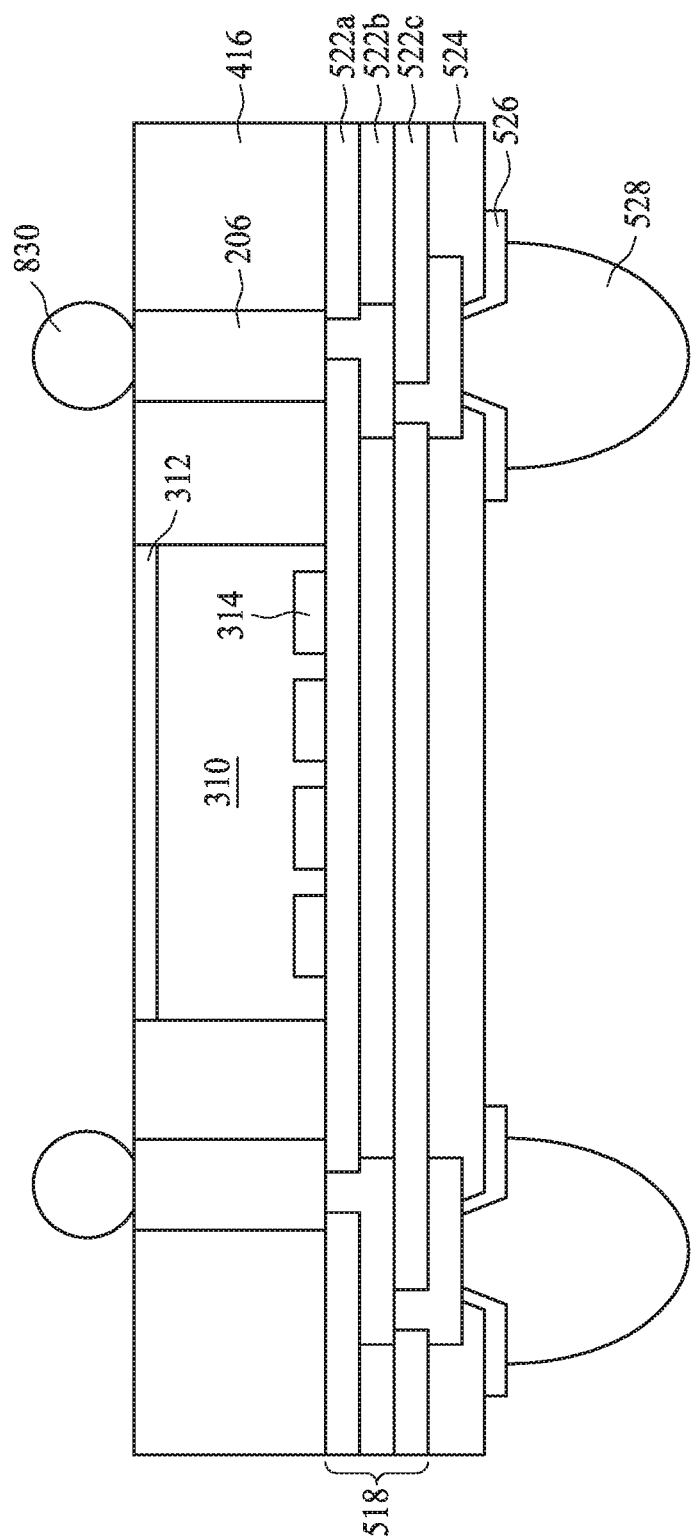

FIG. 8 illustrates formation of backside connectors 830 in accordance with some embodiments. After removal of the backside dielectric layer 104, backside connectors 830 may be formed directly on the through vias 206. The backside connectors 830 may be formed using similar processes and materials as the front-side connectors 528.

Figure 9:
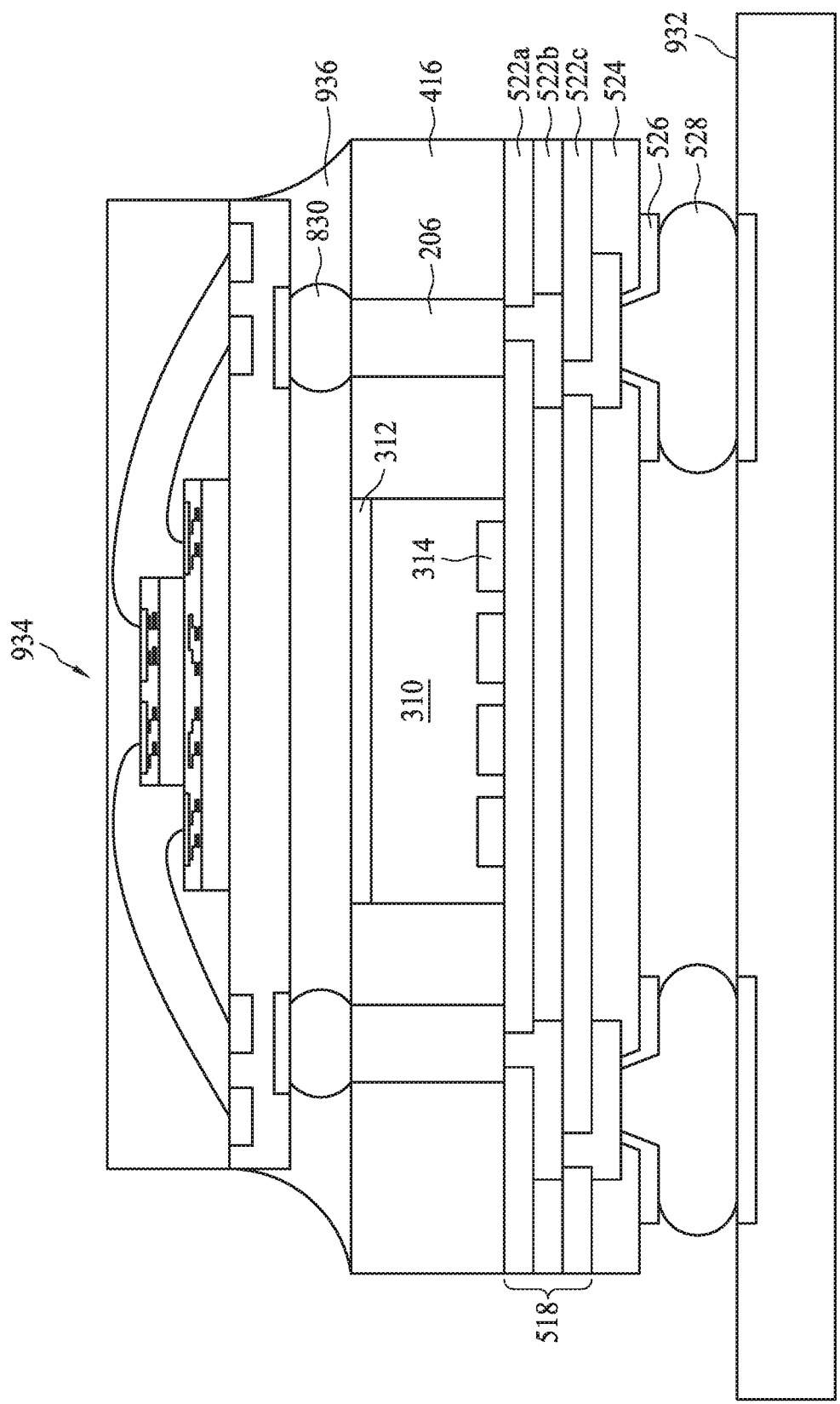

FIG. 9 illustrates attachment of the structure illustrated in FIG. 8 to a first substrate 932 and a second substrate 934 in accordance with some embodiments. Each of the first substrate 932 and the second substrate 934 may be any substrate, such as an integrated circuit die, a package, a printed circuit board, an interposer, or the like. For example, FIG. 9 illustrates an embodiment in which the first substrate 932 comprises a printed circuit board or interposer, and the second substrate 934 comprises another package.

FIG. 9 also illustrates a molding underfill 936 interposed between the second substrate 934 and the molding encapsulant 416 according to some embodiments. In some embodiments, the molding underfill is, for example, a polymer, epoxy, and/or the like. The molding underfill protects the backside connectors 830 from the external environment and may provide additional support. In some embodiments, the molding underfill 936 may extend along sidewalls of the second substrates 934 as shown in FIG. 9. In some embodiments, the molding underfill 936 may not extend along sidewalls of the second substrate 934. Though not shown, a molding underfill may also be formed between the first substrate 932 and passivation layer 524, surrounding the front-side connectors.

The figures provided herein have been simplified for purposes of illustration and other processes may be performed. For example, the structures shown in the figures may represent a single 3DIC package area of a larger wafer-like structure. In some embodiments, the carrier substrate 100 may be a wafer and the integrated circuit die may be one of many die areas formed on the wafer. The second substrate 934 may be one of many attached to the individual die areas and the molding underfill 936 may be formed over the die areas. Thereafter, a singulation process may be performed to separate the individual die areas into separate 3DIC structures such as that illustrated in FIG. 9.

Figure 10:
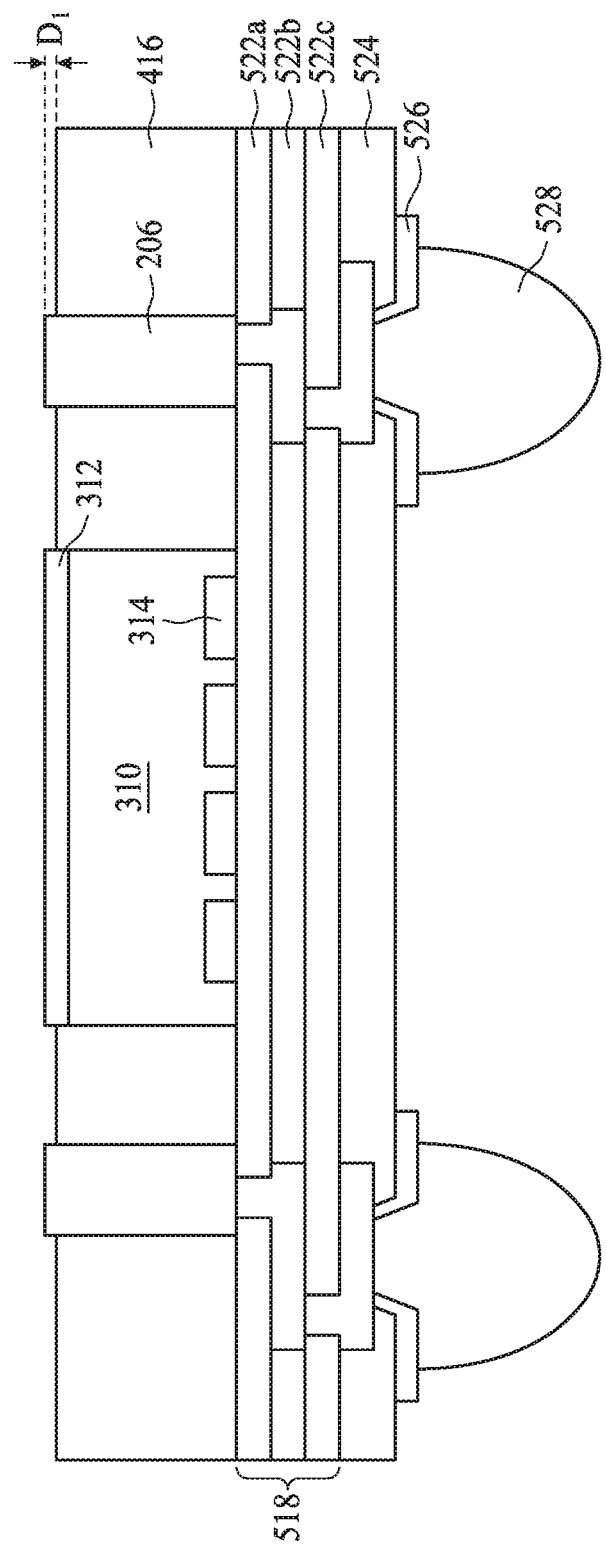
FIGS. 10-12 are cross-sectional views of various intermediate steps of forming semiconductor device in accordance with some embodiments.
Figure 11:
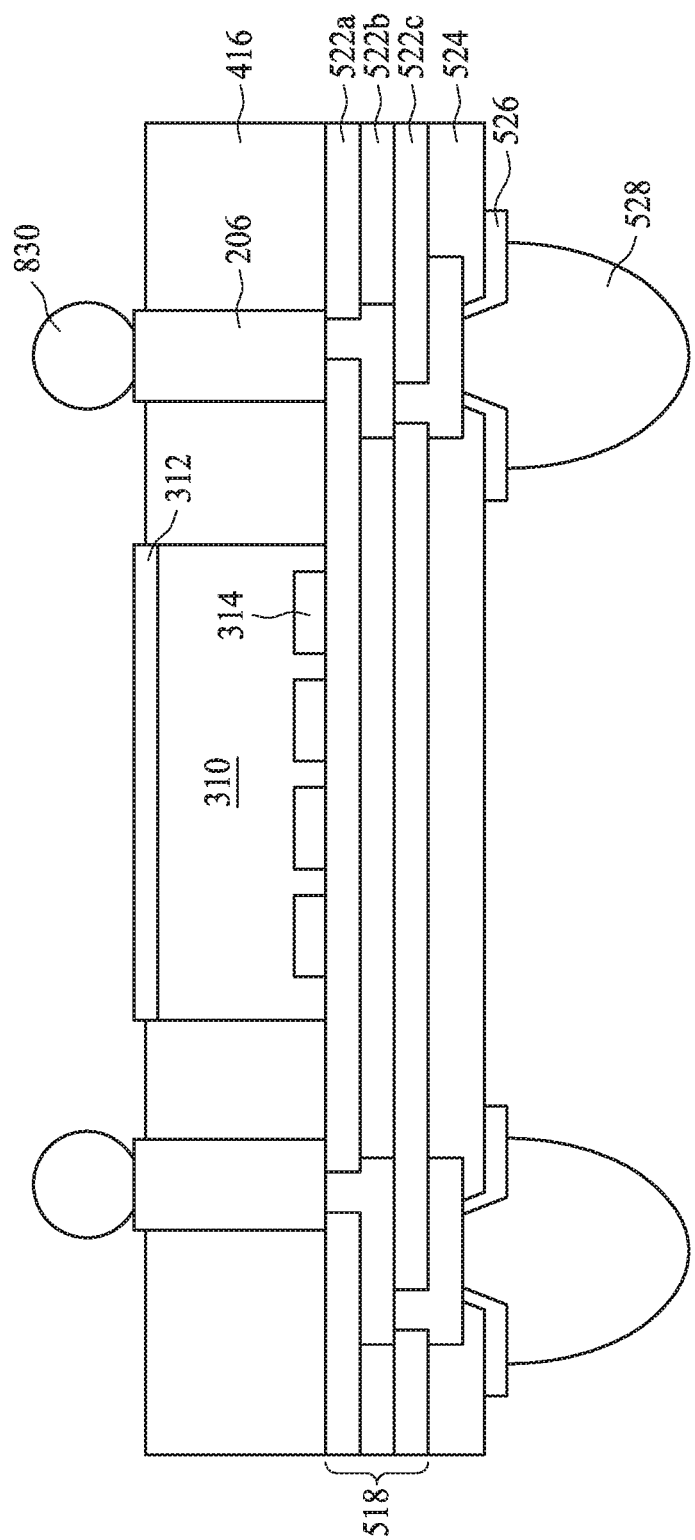
Figure 12:
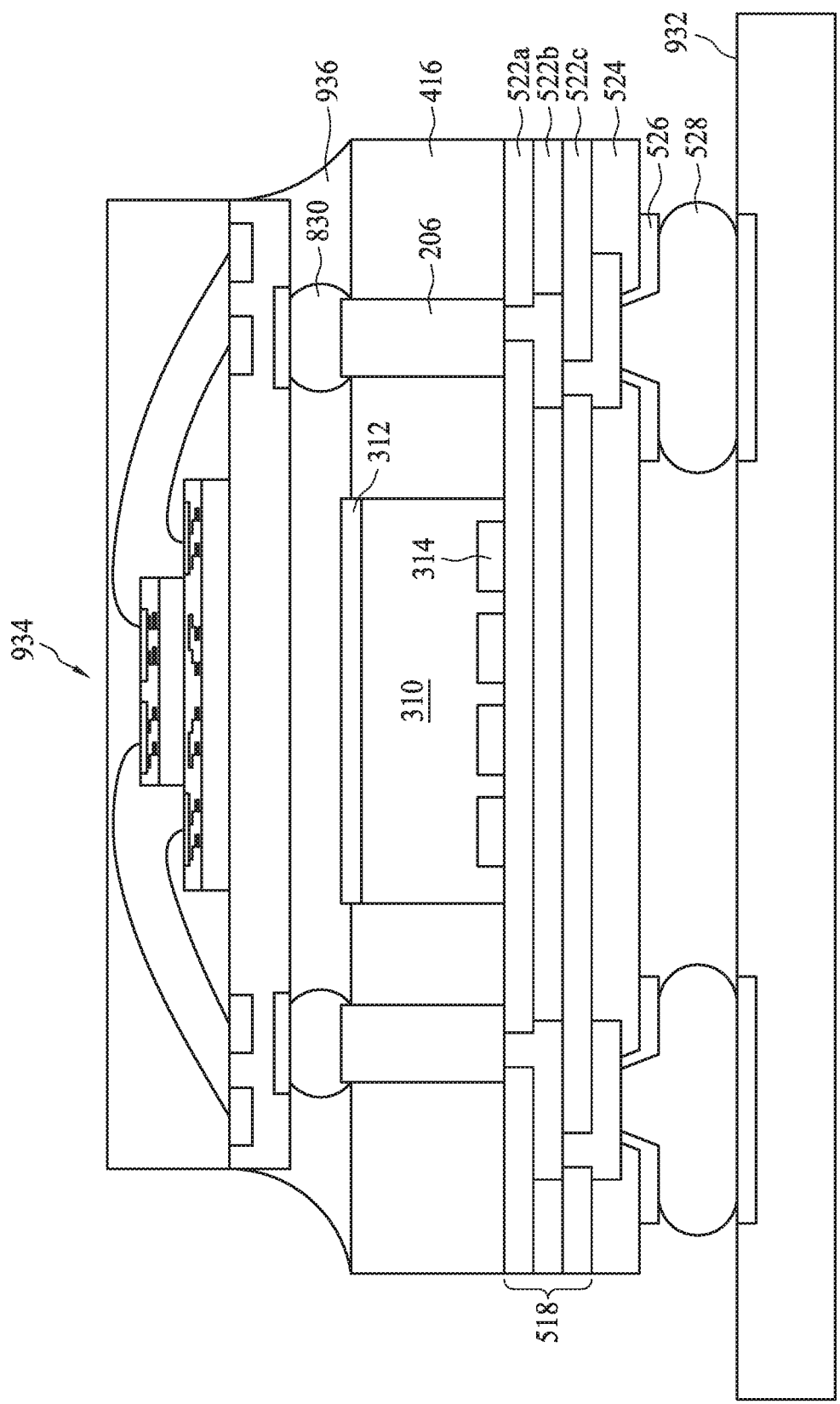

FIGS. 10-12 illustrate cross-sectional views of intermediate steps in forming a semiconductor package in accordance with some additional embodiments. Many of the structures illustrated in FIGS. 10-12 may be formed using similar processes and materials as discussed above with reference to FIGS. 1-9, wherein like reference numerals refer to like elements, and accordingly, the description of those elements will not be repeated herein. The embodiments illustrated in FIGS. 10-12 assume the processes discussed above with reference to FIGS. 1-6 have been performed. Accordingly, the method disclosed herein include the processes illustrates in FIGS. 1-6 followed by the processes illustrated in FIGS. 10-12.

Referring now to FIG. 10, the backside dielectric layer 104 (see FIG. 6) is removed and the encapsulant 416 is recessed in accordance with some embodiments. As discussed above with reference to FIG. 7, the backside dielectric layer 104 was removed such that the encapsulant 416 was not recessed. FIG. 10 illustrates embodiments in which the encapsulant 416 is recessed, thereby causing the through vias 206 to protrude through or extend above the surface of the encapsulant 416 such that a portion of the sidewalls of the through vias 206 are exposed.

In some embodiments, the backside dielectric layer 104 is removed and the encapsulant 416 is recessed using, for example, an over etch process. For example, in some embodiments, the backside dielectric layer 104 is removed in a similar manner as discussed above with reference to FIG. 7 with a longer etch time. The etch process is selective in that little or no etching occurs to the through vias 206, while the longer etch time allows the etch process to continue to etch and recess the encapsulant 416.

In some embodiments, the encapsulant 416 is recessed by depth D1 of equal to or greater than 2 µm. By recessing the encapsulant 416 and exposing sidewalls of the through vias 206 by a distance such as this, backside connectors 830 (e.g., solder) subsequently formed over the through vias 206 may extend along the sidewalls of the through vias 206, increasing the contact surface area. In some embodiments, this increased contact surface between the solder and the through vias 206 may increase the reliability.

Referring now to FIG. 11, there is illustrated formation of backside connectors 830 in accordance with some embodiments. The backside connectors may be formed using similar processes and materials as the front-side connectors 528 as discussed above with reference to FIG. 5.

FIG. 12 illustrates attachment of the structure illustrated in FIG. 11 to a first substrate 932 and a second substrate 934 in accordance with some embodiments. Each of the first substrate 932 and the second substrate 934 may be any substrate, such as an integrated circuit die, a package, a printed circuit board, an interposer, or the like. For example, FIG. 12 illustrates an embodiment in which the first substrate 932 comprises a printed circuit board or interposer, and the second substrate 934 comprises another package.

FIG. 12 also illustrates a molding underfill 936 interposed between the second substrate 934 and the molding encapsulant 416 according to some embodiments. In some embodiments, the molding underfill 936 is, for example, a polymer, epoxy, and/or the like. The molding underfill 936 protects the backside connectors 830 from the external environment and may provide additional support. In some embodiments, the molding underfill 936 may extend along sidewalls of the second substrate 934 as shown in FIG. 12. In some embodiments, the molding underfill 936 may not extend along sidewalls of the second substrate 934. Though not shown, a molding underfill may also be formed between the first substrate 932 and passivation layer 524, surrounding the front-side connectors.

The recessing of the encapsulant 416 by over etching may also roughen a surface of the encapsulant 416. The roughened surface of the encapsulant 416 may increase the bonding between the encapsulant and the molding underfill 936, thereby reducing or preventing delamination issues.

FIGS. 13-20 illustrate cross-sectional views of intermediate steps in forming a semiconductor package in accordance with some additional embodiments. Many of the structures illustrated in FIGS. 13-20 may be formed using similar processes and materials as discussed above with reference to FIGS. 1-12, wherein like reference numerals refer to like elements, and accordingly, the description of those elements will not be repeated herein.

Figure 13:
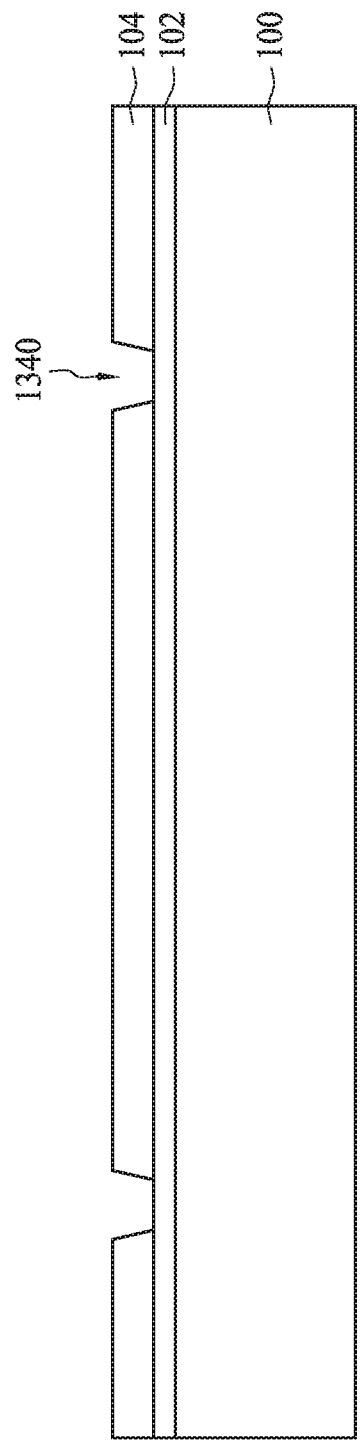
FIGS. 13-20 are cross-sectional views of various intermediate steps of forming semiconductor device in accordance with some embodiments.

Referring first to FIG. 13, there is shown the carrier substrate 100 having the release layer 102 and the backside dielectric layer 104 formed thereon. The carrier substrate 100, the release layer 102, and the backside dielectric layer 104 may be formed of similar materials using similar processes as described above with reference to FIG. 1. As illustrated in FIG. 13, the backside dielectric layer 104 has been patterned to form openings 1340 therein. Whereas the embodiment discussed above with reference to FIGS. 1-2 utilized a through via having a relatively flat surface, as discussed below in greater detail, the openings 1340 will be utilized to form through vias having one or more projections extending from an end of the through vias.

In embodiments in which the backside dielectric layer 104 is formed of a photosensitive material, such as PBO, the backside dielectric layer 104 may be patterned by exposing the backside dielectric layer 104 in accordance with a desired pattern of the projections and developing the backside dielectric layer 104 to remove portions of the backside dielectric layer 104 corresponding to the locations of the projections. In some embodiments, the backside dielectric layer 104 has a thickness of about 1 µm to about 10 µm, such as about 7 µm. As will be discussed in greater detail below, a through via will subsequently be formed over the backside dielectric layer 104, wherein the openings 1340 correspond to through via projections. A thickness of about 7 µm provides a sufficient thickness to shape the through via projections (e.g., tapered sidewalls) as well as providing a sufficient process window for an over etch process to expose portions of the sidewalls of the through via projections.

Figure 14:
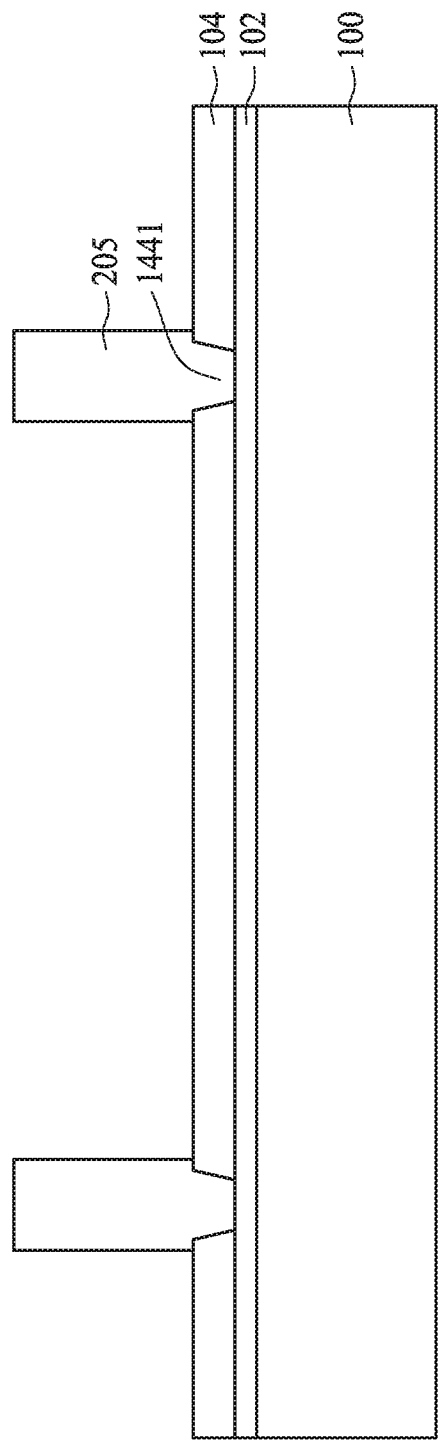
Figure 15:
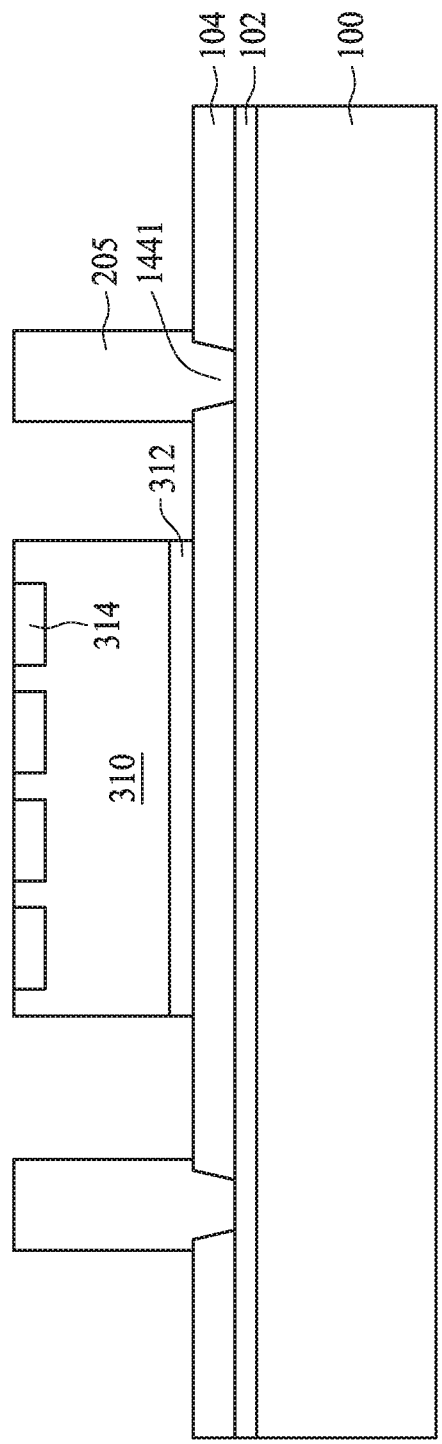

FIGS. 14-18 illustrate subsequent processes similar to those discussed above with reference to FIGS. 2-6, respectively. As illustrated in FIG. 14, the conductive structures 205 include conductive structure projections 1441, corresponding to the openings 1340 illustrated in FIG. 13. The conductive structures 205 and the conductive structure projections 1441 may be formed using similar processes and materials discussed above. For example, the seed layer (not shown) may be formed over the backside dielectric layer 104 and along sidewalls and a bottom of the openings 1340. A patterned mask (not shown) may be formed over the seed layer, wherein the patterned mask has openings corresponding to the locations of the conductive structures 205. A conductive material is formed in the openings, the patterned mask is removed, and excess material of the seed layer is removed, forming the conductive structures 205 having the conductive structure projections 1441 as illustrated in FIG. 14.

Figure 16:
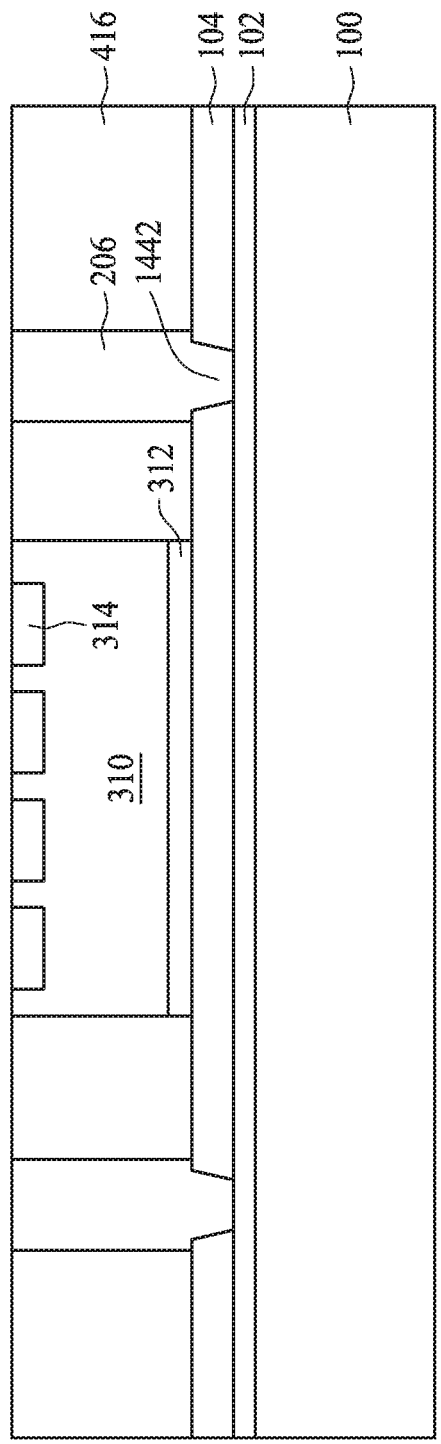
Figure 17:
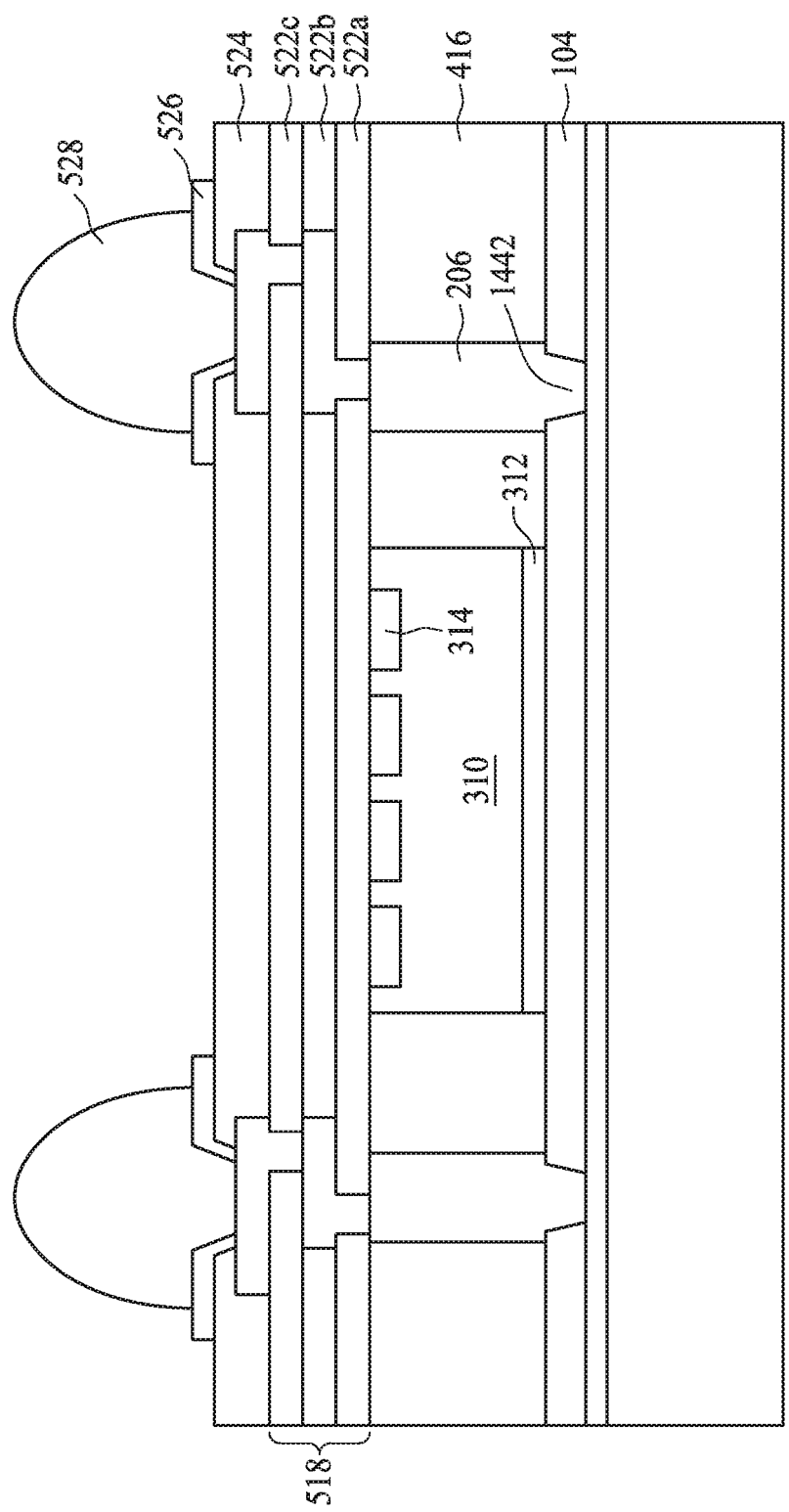
Figure 18:
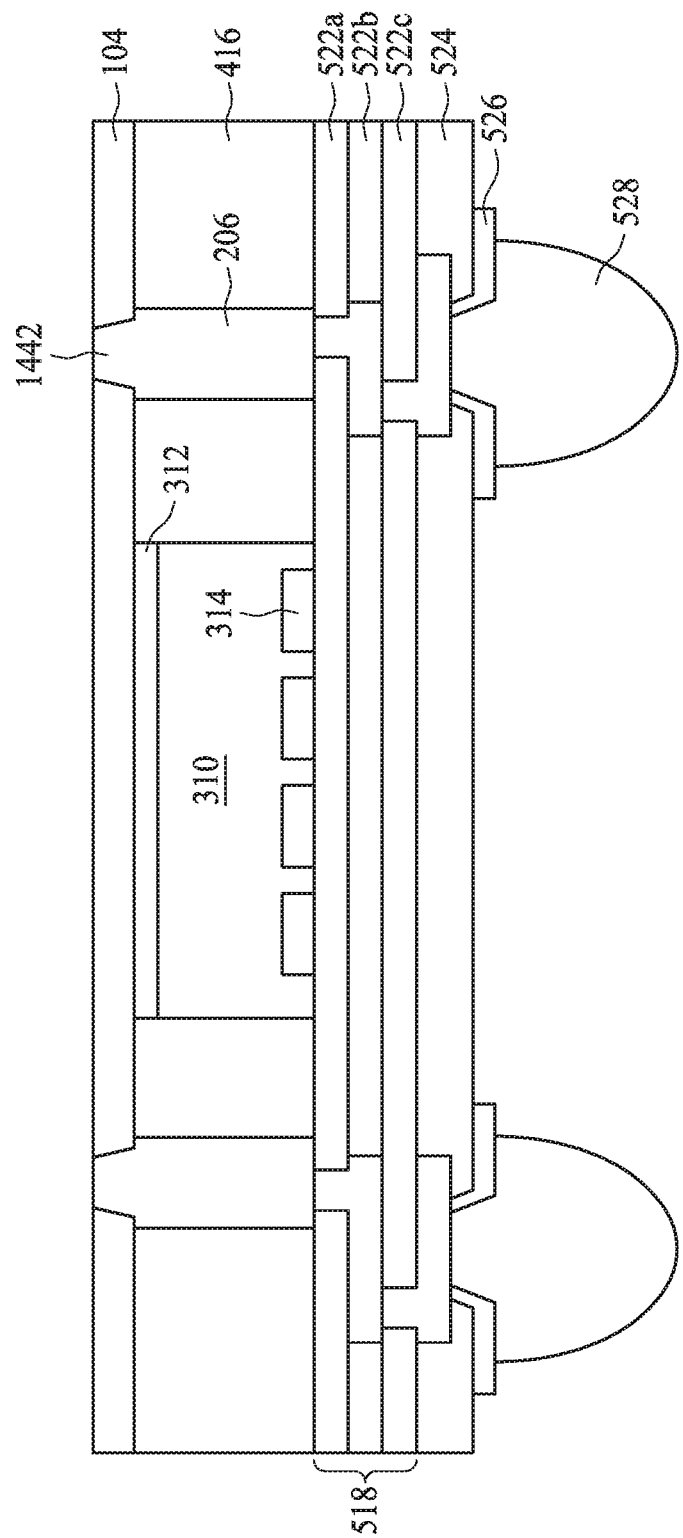

FIG. 18 illustrates the structure after performing the processes discussed above with reference to FIGS. 2-6, including the removal of the carrier substrate 100 and the release layer 102. As illustrated in FIG. 16, an encapsulant 416 is formed adjacent the conductive structures 205, thereby forming through vias 206 and through via projections 1442. In some embodiments, the backside dielectric layer 104 remains such that a surface of the backside dielectric layer 104 is relatively planar with the through via projections 1442, allowing for process variations of forming the through vias 206 and the backside dielectric layer 104 on the same release layer 102.

Figure 19:
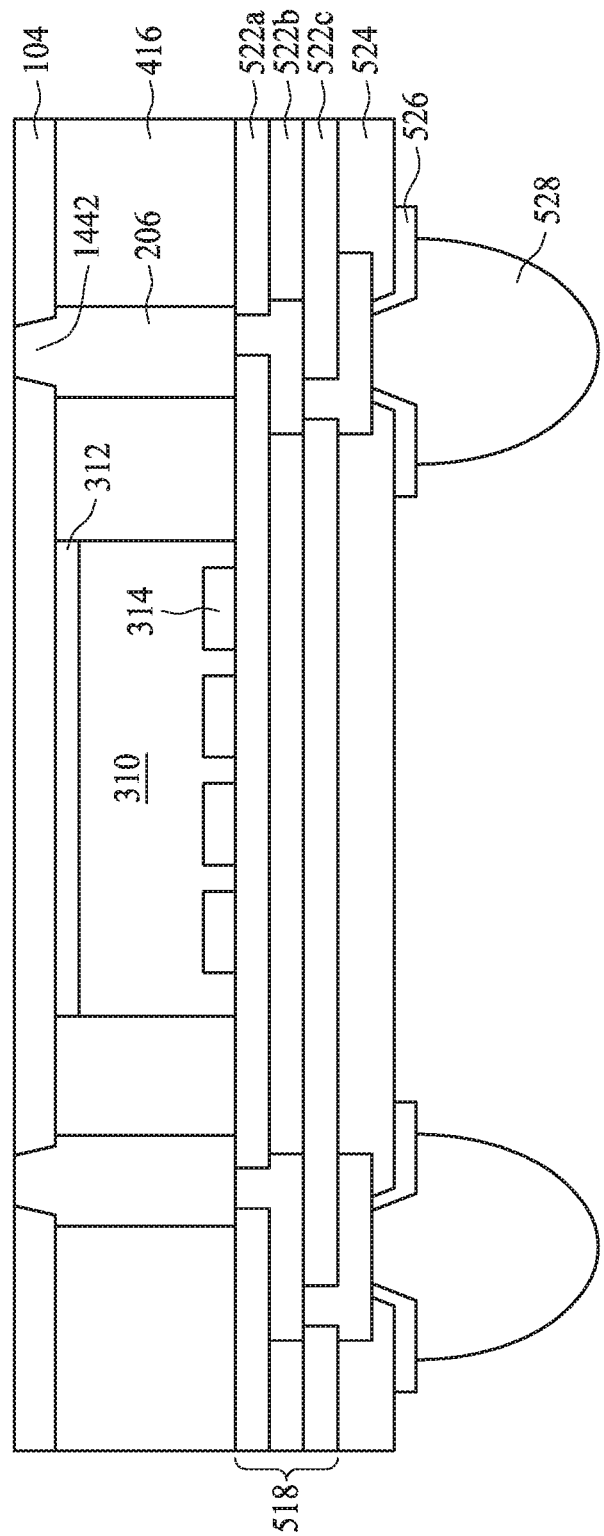
Figure 20:
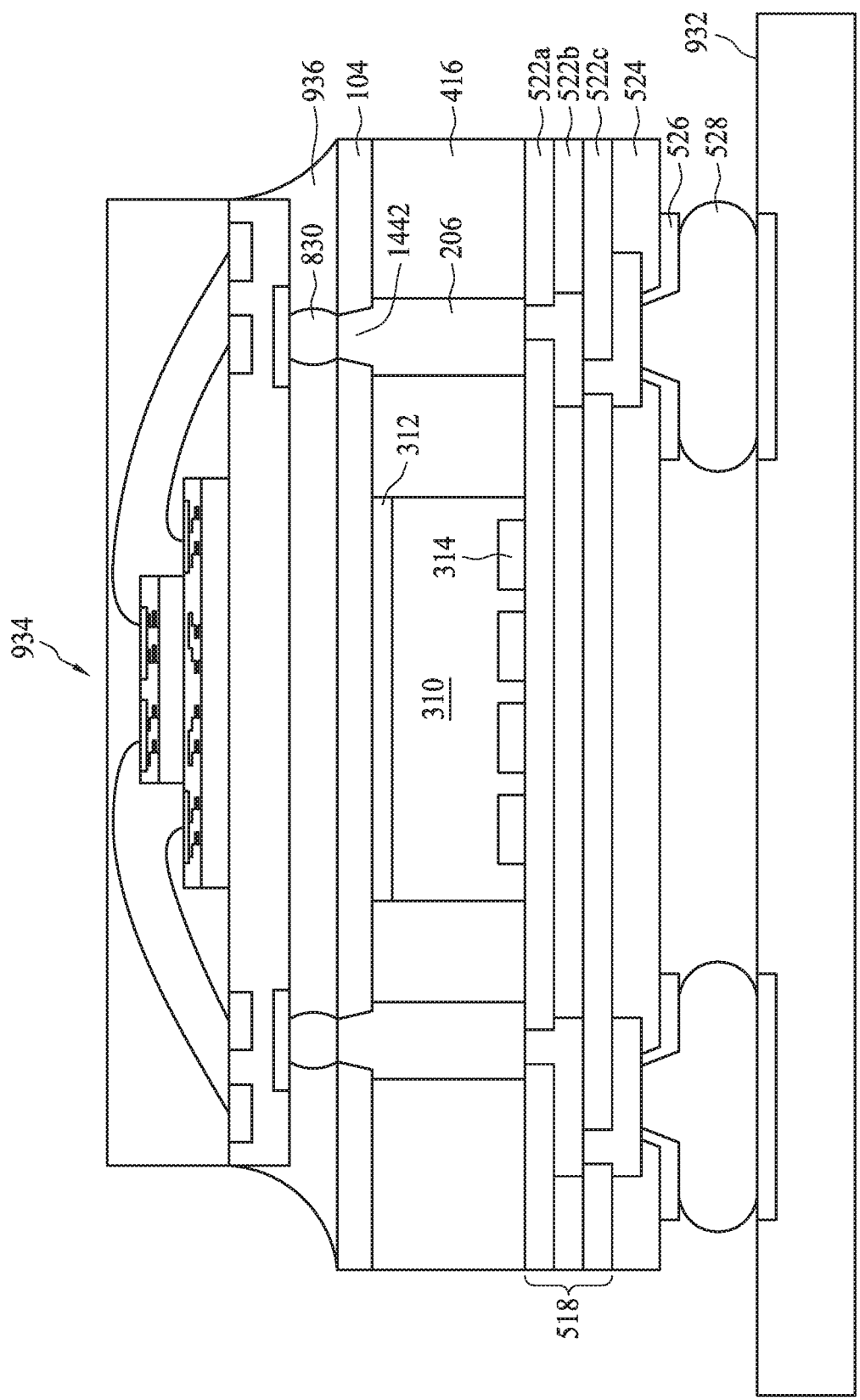

Thereafter, as illustrated in FIGS. 19 and 20, processes similar to those discussed above with reference to FIGS. 8 and 9, respectively, may be performed to form the backside connectors 830, attach the structure to other substrates (e.g., the first substrate 932 and/or the second substrate 934), and forming a molding underfill 936. As illustrated in FIG. 20, the backside connectors 830 connect directly to the through via projections 1442 in some embodiments. In some embodiments, the backside connectors 830 may be provided on the second substrate 934 and then attached to the through via projections 1442.

Figure 21:
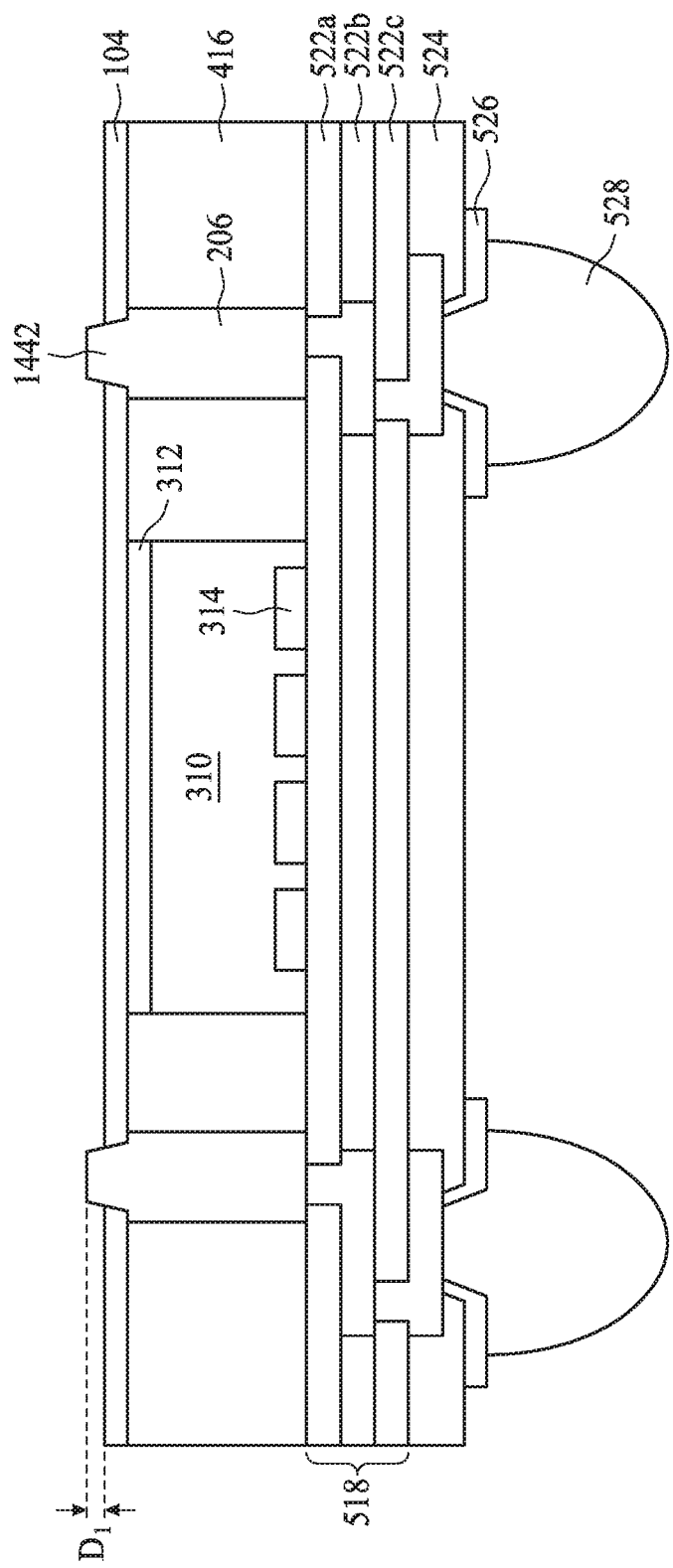
FIGS. 21-23 are cross-sectional views of various intermediate steps of forming semiconductor device in accordance with some embodiments.
Figure 22:
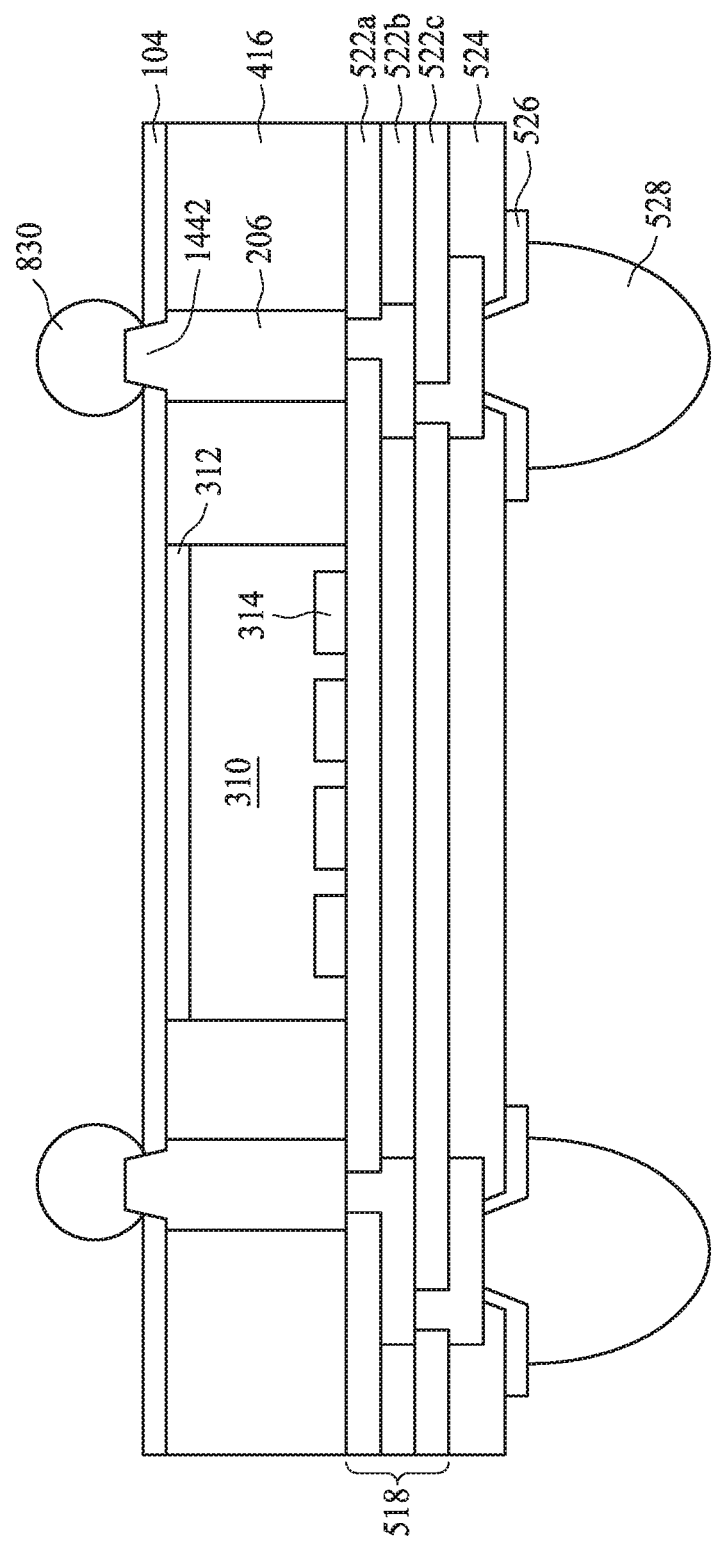
Figure 23:
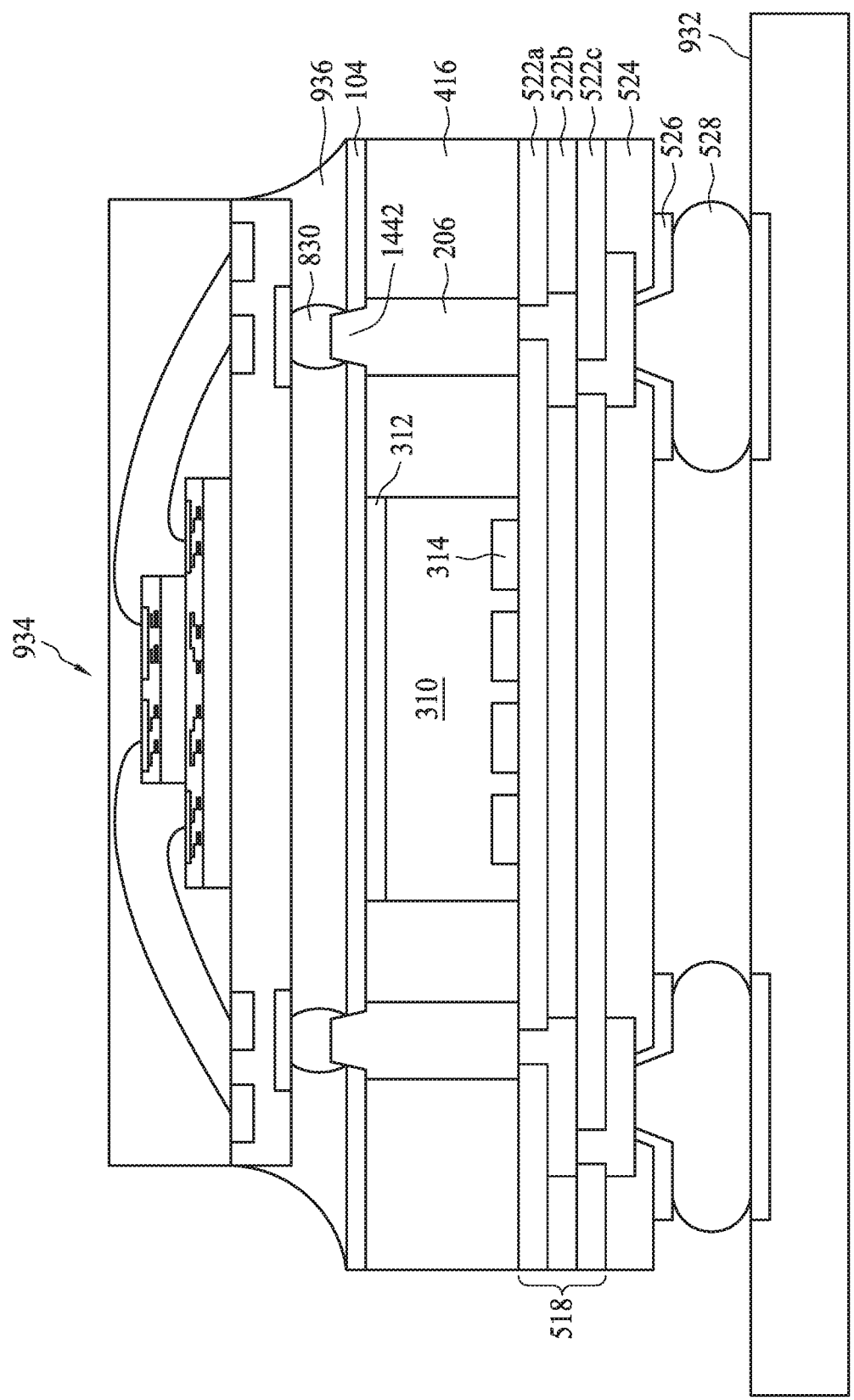

FIGS. 21-23 illustrate cross-sectional views of intermediate steps in forming a semiconductor package in accordance with some embodiments. FIGS. 21-23 assume the processes discussed above with reference to FIGS. 13-18 have been previously performed, wherein like reference numerals refer to like elements. Referring first to FIG. 21, there is shown the structure of FIG. 18 after performing a recess process to recess the backside dielectric layer 104 to expose at least portions of the sidewalls of the through via projections 1442. The recess process may be performed using a dry etch process using, for example, Ar, $N_2$, $CF_4$, $O_2$, or the like. The recess process may result in exposing sidewalls of the through via projections 1442 increasing the wetting surface for the subsequently formed backside connectors 830. In some embodiments, the backside dielectric layer 104 is recessed such that the through via projections 1442 protrude for a distance D1 greater than about 2 µm.

By recessing the backside dielectric layer 104 and exposing sidewalls of the through vias projections 1442 by a distance such as D1, backside connectors 830 (e.g., solder) subsequently formed over the through vias projections 1442 may extend along the sidewalls of the through vias projections 1442 and/or the through vias 206, increasing the contact surface area. In some embodiments, this increased contact surface between the solder and the through vias projections 1442 and/or the through vias 206 may increase the reliability.

Thereafter, as illustrated in FIGS. 22 and 23, processes similar to those discussed above with reference to FIGS. 19 and 20, respectively, may be performed to form the backside connectors 830, attach the structure to other substrates (e.g., the first substrate 932 and/or the second substrate 934), and forming a molding underfill 936. In some embodiments, the molding underfill 936 may not extend along sidewalls of the second substrate 934. As illustrated in FIG. 22, the backside connectors 830 sit directly on the through via projections 1442 in some embodiments. Though not shown, a molding underfill may also be formed between the first substrate 932 and passivation layer 524, surrounding the front-side connectors.

Figure 24:
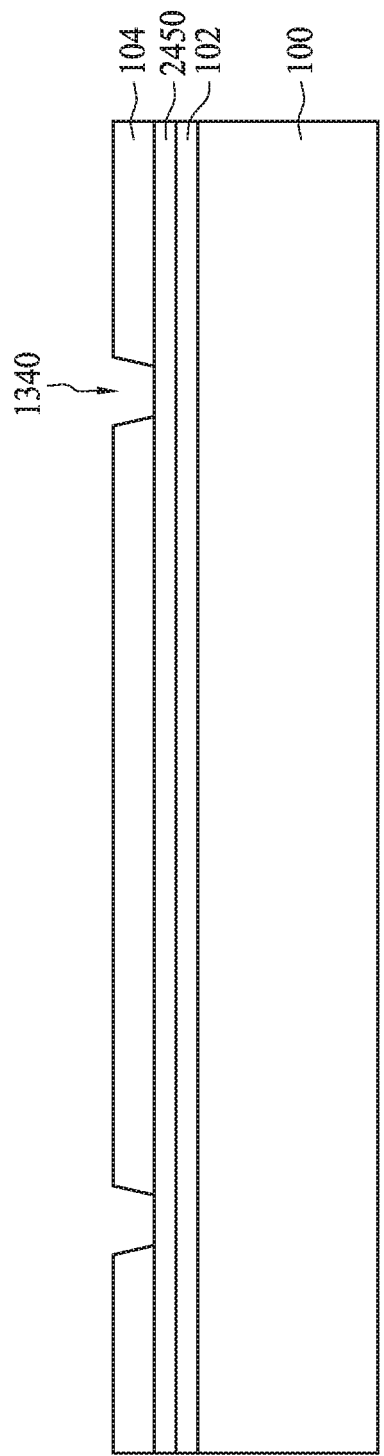
FIGS. 24-31 are cross-sectional views of various intermediate steps of forming semiconductor device in accordance with some embodiments.
Figure 25:
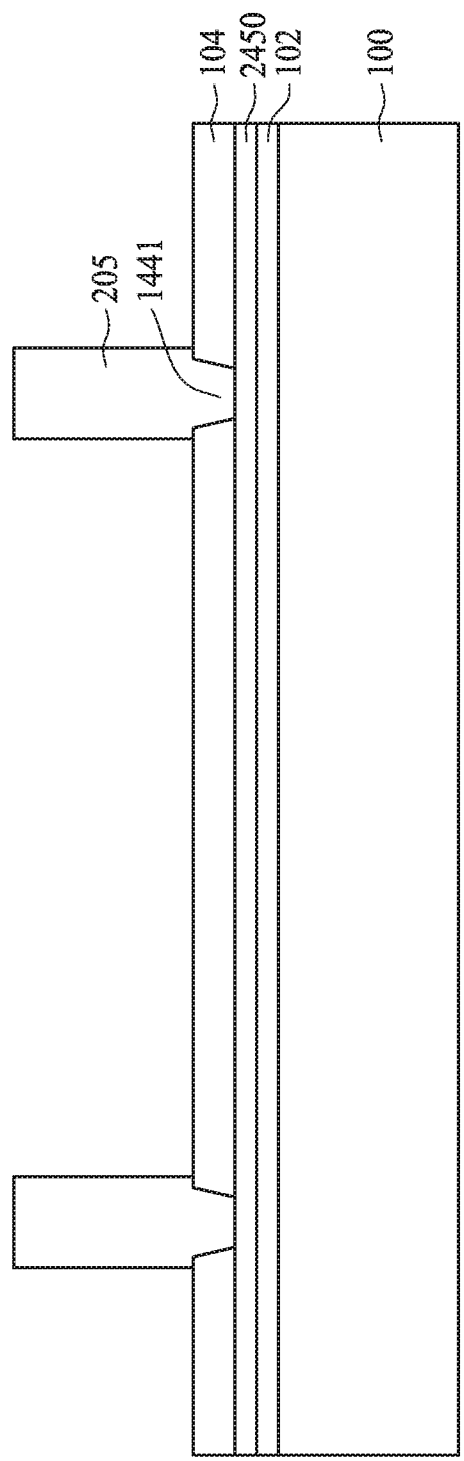
Figure 26:
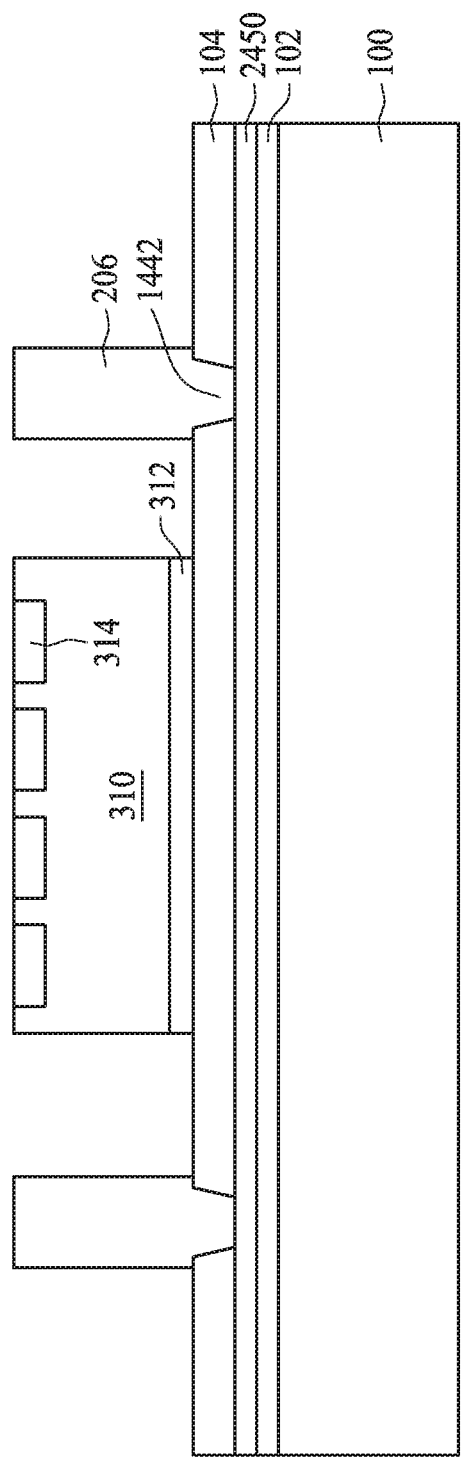
Figure 27:
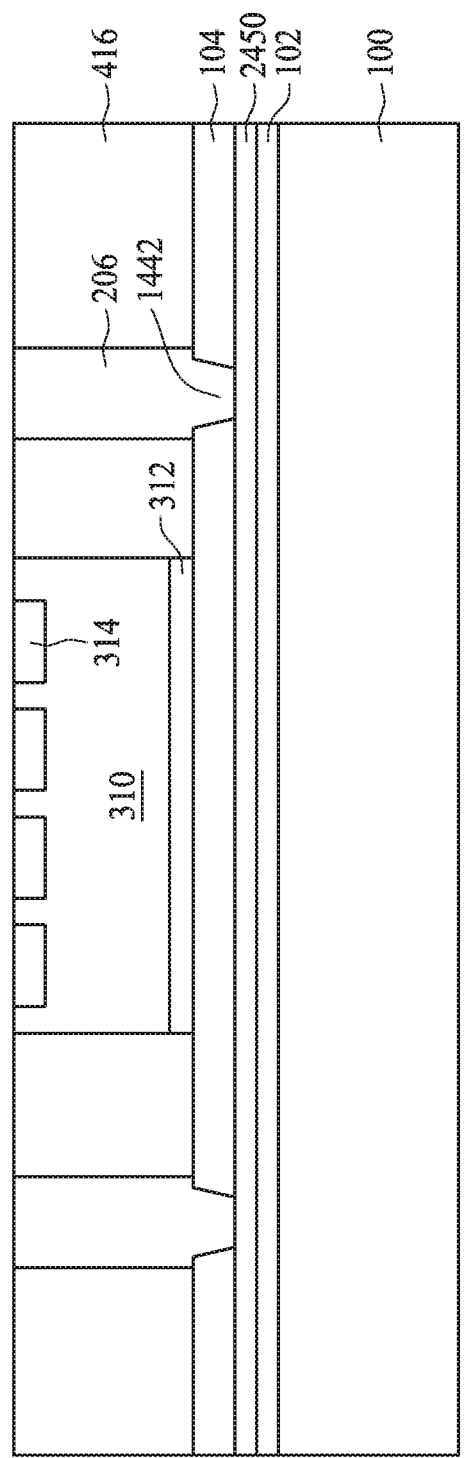
Figure 28:
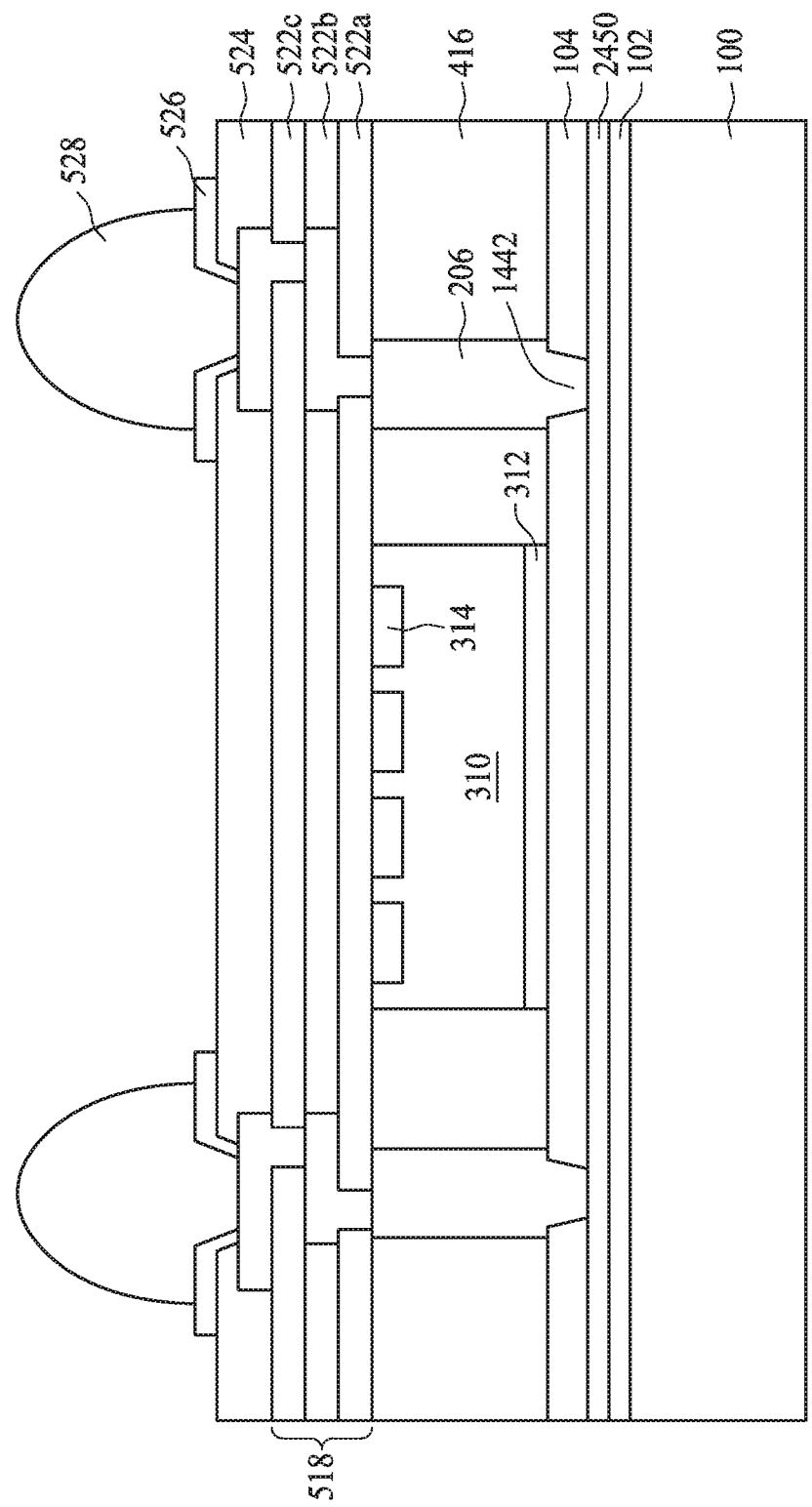

FIGS. 24-29 illustrate cross-sectional views of intermediate steps in forming a semiconductor package in accordance with some embodiments. As will be explained in greater detail below, a sacrificial layer will be used to aid in the process of forming through vias having one or more through via projections, similar to the structure discussed above with reference to FIGS. 21-23. Referring first to FIG. 24, similar processes and similar materials are used to form a structure similar to that discussed above with reference to FIG. 13 having an additional feature of a sacrificial backside dielectric layer 2450 being formed over the release layer 102 prior to forming the backside dielectric layer 104, wherein like reference numerals refer to like elements.

In some embodiments, the sacrificial backside dielectric layer 2450 may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, the sacrificial backside dielectric layer 2450 is a photoresist material (e.g., PBO) that has been coated on the surface and developed. In some embodiments, the sacrificial layer 2450 has a thickness of about 2 µm.

Thereafter, the backside dielectric layer 104 is formed and patterned over the sacrificial backside dielectric layer 2450. In some embodiments, the backside dielectric layer 104 is a photoresist material (e.g., PBO) that has been coated, exposed, and developed to form the openings 1340 as illustrated in FIG. 24. Because the sacrificial backside dielectric layer 2450 has been cured, the sacrificial backside dielectric layer 2450 remains during the patterning of the backside dielectric layer 104. In some embodiments, the backside dielectric layer 104 has a thickness of about 1 µm to about 10 µm, such as about 7 µm. As will be discussed in greater detail below, a through via will subsequently be formed over the backside dielectric layer 104, wherein the openings 1340 correspond to through via projections. A thickness of about 7 µm provides a sufficient thickness to shape the through via projections (e.g., tapered sidewalls) as well as providing a sufficient process window for an over etch process to expose portions of the sidewalls of the through via projections.

Figure 29:
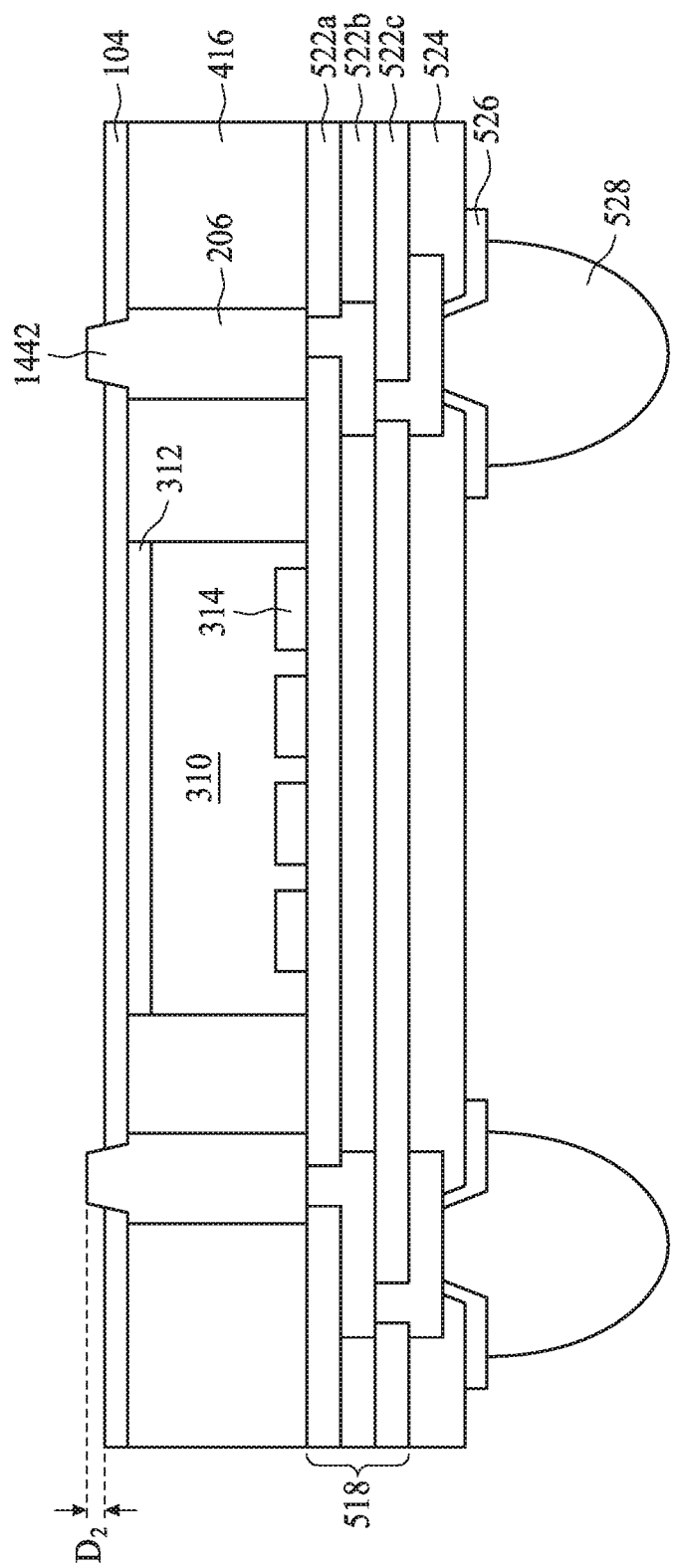

FIGS. 25-28 illustrate similar processes as those discussed above with reference to FIGS. 14-17, respectively, wherein like reference numerals refer to like elements, except the sacrificial backside dielectric layer 2450 is present. After removing the carrier substrate 100 and the release layer 102, the sacrificial backside dielectric layer 2450 may be removed as illustrated in FIG. 29. In some embodiments, the sacrificial backside dielectric layer 2450 is formed of a similar material as the backside dielectric layer 104 and is removed in a manner similar to the backside dielectric layer 104 as discussed above with reference to FIG. 21. For example, the removal of the sacrificial backside dielectric layer 2450 may be performed using a dry etch process using, for example, Ar, $N_2$, $CF_4$, $O_2$, or the like. The removal process may be controlled to over etch such that the backside dielectric layer 104 is recessed below a surface of the through via projections 1442 such that portions of sidewalls of the through via projections 1442 are exposed. In some embodiments, the backside dielectric layer 104 is recessed such that the through via projections 1442 protrude for a distance D2 equal to or greater than about 2 µm. By recessing the backside dielectric layer 104 and exposing sidewalls of the through vias projections 1442 by a distance such as D2, backside connectors 830 (e.g., solder) subsequently formed over the through vias projections 1442 may extend along the sidewalls of the through vias projections 1442 and/or the through vias 206, increasing the contact surface area. In some embodiments, this increased contact surface between the solder and the through vias projections 1442 and/or the through vias 206 may increase the reliability.

Figure 30:
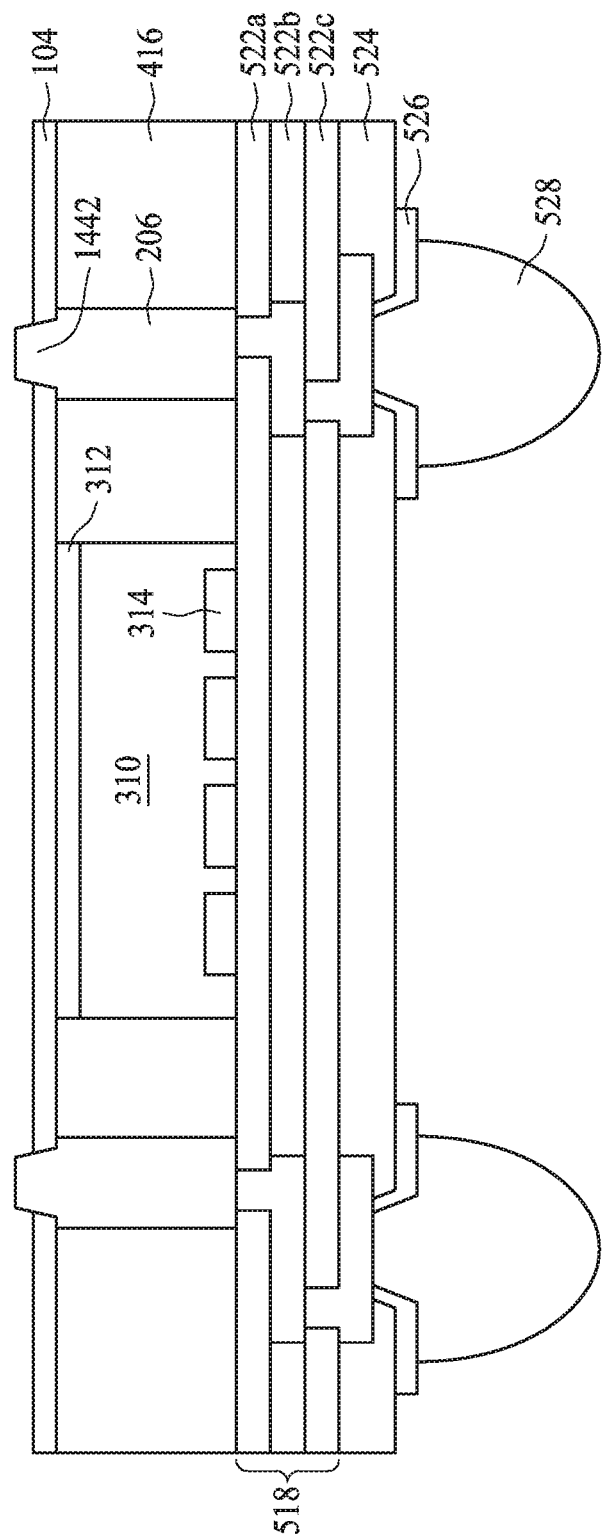
Figure 31:
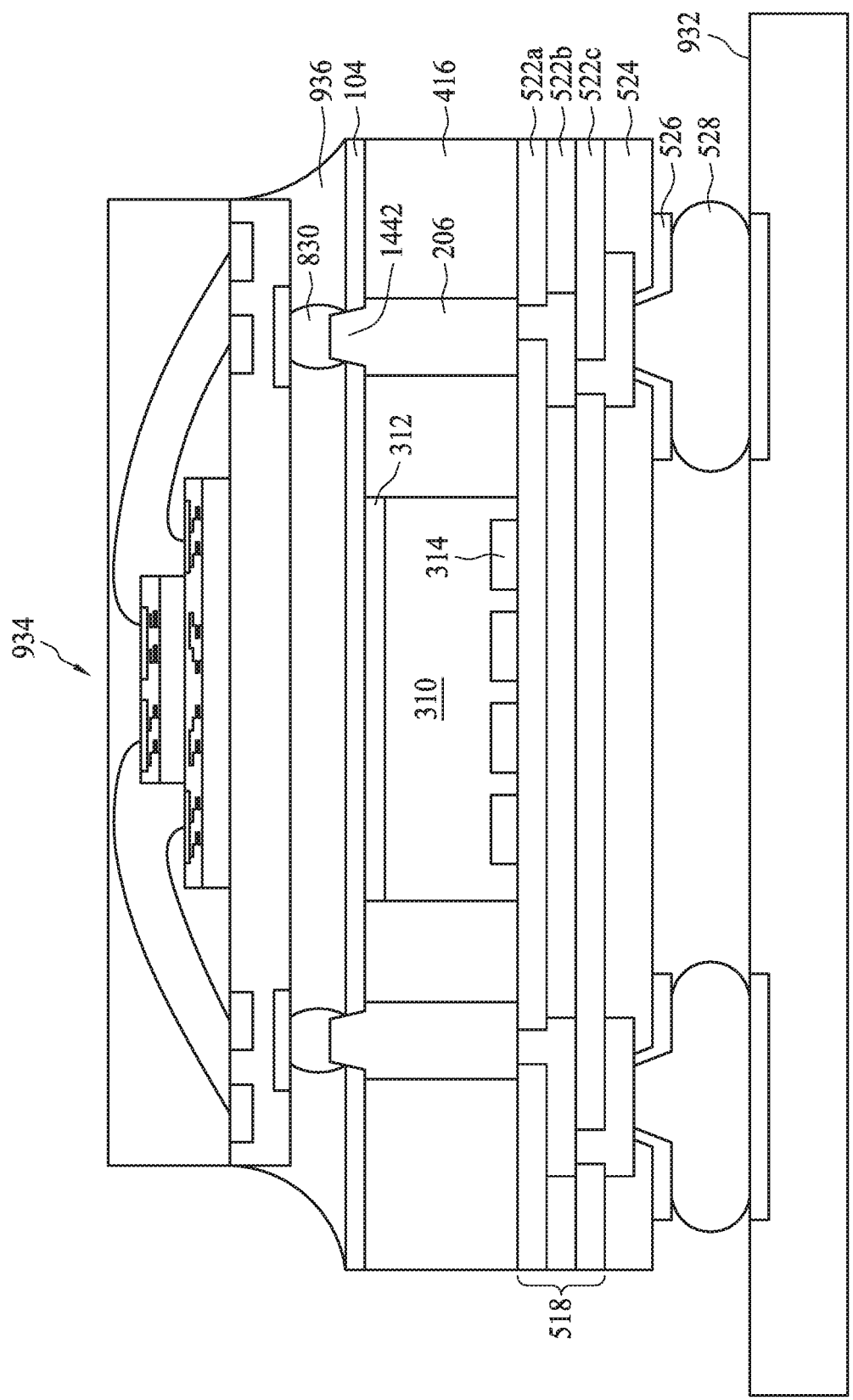

Thereafter, as illustrated in FIGS. 30 and 31, processes similar to those discussed above with reference to FIGS. 19 and 20, respectively, may be performed to form the backside connectors 830, attach the structure to other substrates (e.g., the first substrate 932 and/or the second substrate 934), and forming a molding underfill 936. In some embodiments, the molding underfill 936 may not extend along sidewalls of the second substrate 934. Though not shown, a molding underfill may also be formed between the first substrate 932 and passivation layer 524, surrounding the front-side connectors. As illustrated in FIG. 31, the backside connectors 830 sit directly on and extend along sidewalls of the through via projections 1442 in some embodiments.

FIGS. 32-40 illustrate cross-sectional views of intermediate steps in forming a semiconductor package in accordance with some embodiments. As discussed above, the through vias 206 are exposed after the removal of the carrier substrate 100. In some embodiments, a backside redistribution structure may be formed over the backside dielectric layer 104 prior to forming the through vias 206. Accordingly, FIGS. 32-40 illustrate an embodiment similar to that discussed above with reference to FIGS. 24-31 with a backside redistribution structure.

Figure 32:
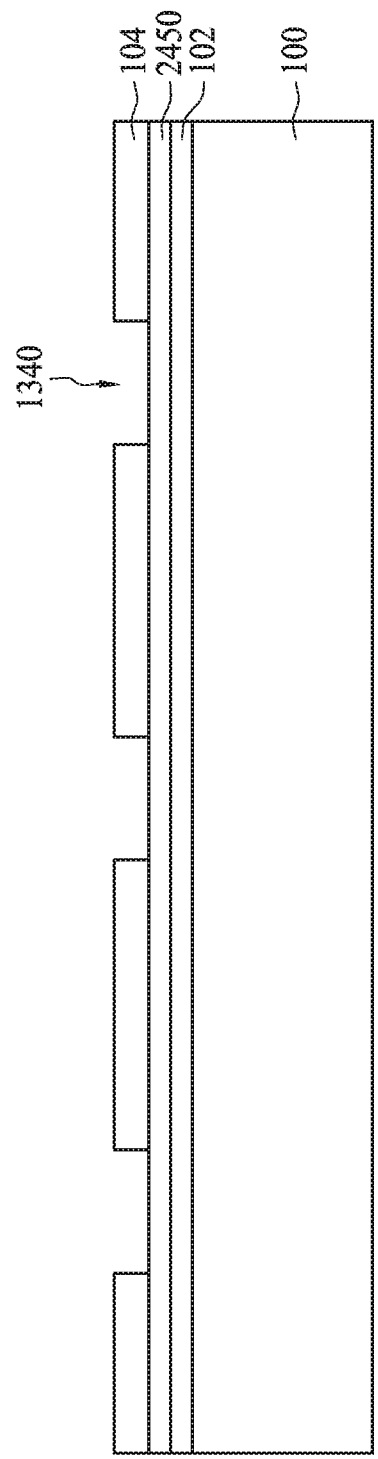
FIGS. 32-40 are cross-sectional views of various intermediate steps of forming semiconductor device in accordance with some embodiments.

Referring first to FIG. 32, there is shown an embodiment similar to that illustrated in FIG. 24, wherein like reference numerals refer to like elements. Where the openings 1340 in the backside dielectric layer 104 corresponds to the through via projections 1442 in FIG. 24, the openings 1340 in the backside dielectric layer 104 in FIG. 32 corresponds to an outermost backside redistribution layer. In some embodiments, the backside dielectric layer 104 has a thickness of about 1 µm to about 10 µm, such as about 7 µm. A thickness such as this provides a sufficient thickness for a conductive layer and process window to partially expose sidewalls of the backside dielectric layer 104 in a subsequent step.

Figure 33:
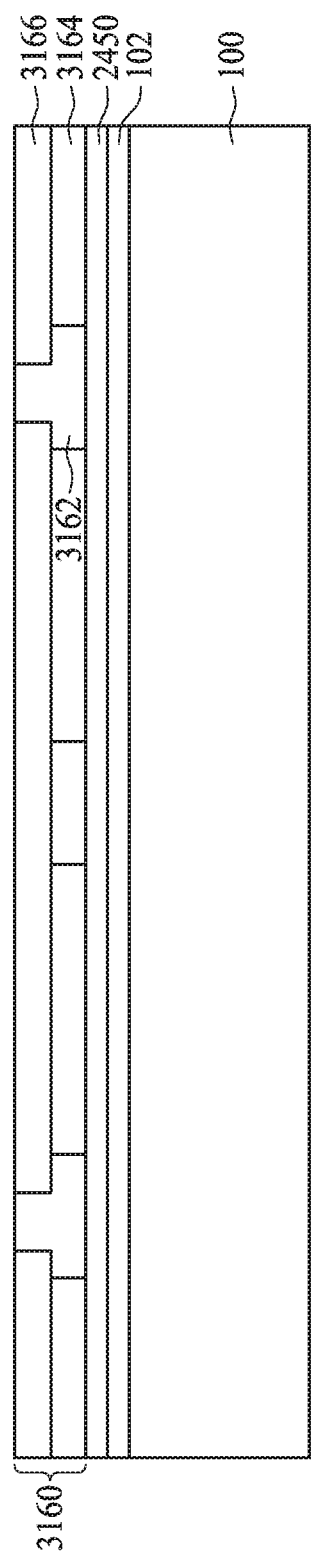
Figure 34:
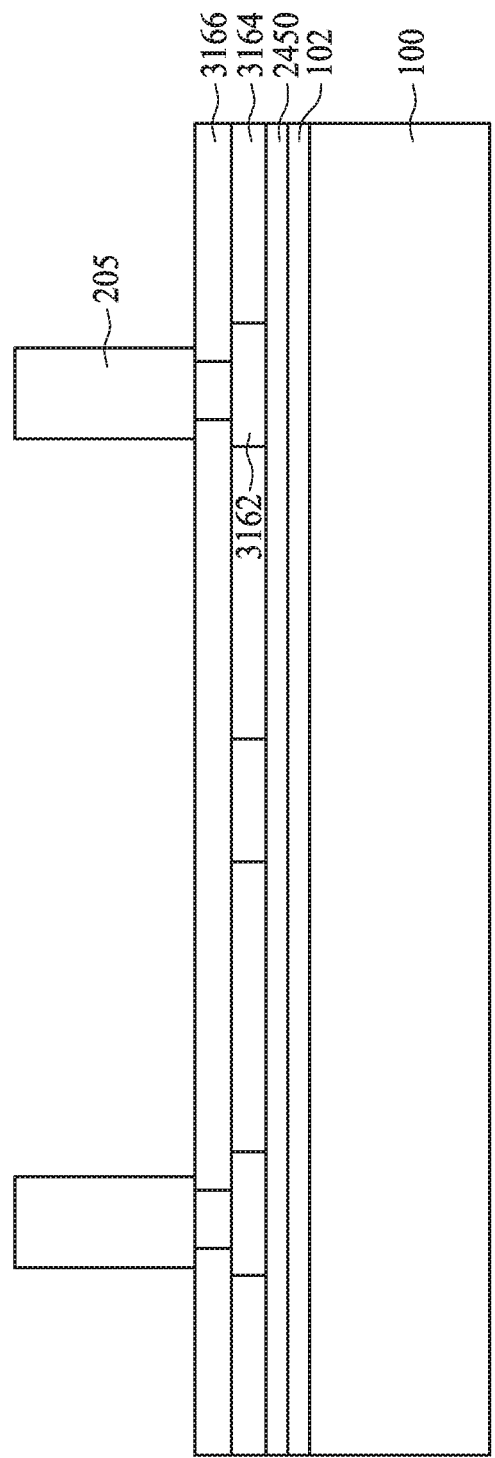
Figure 35:
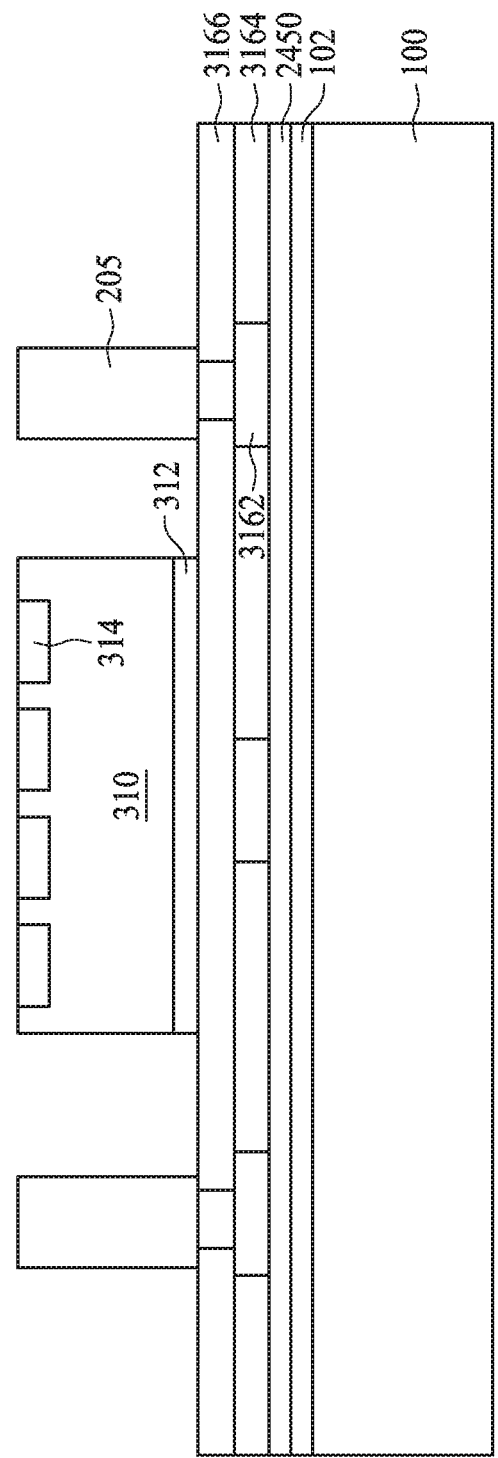
Figure 36:
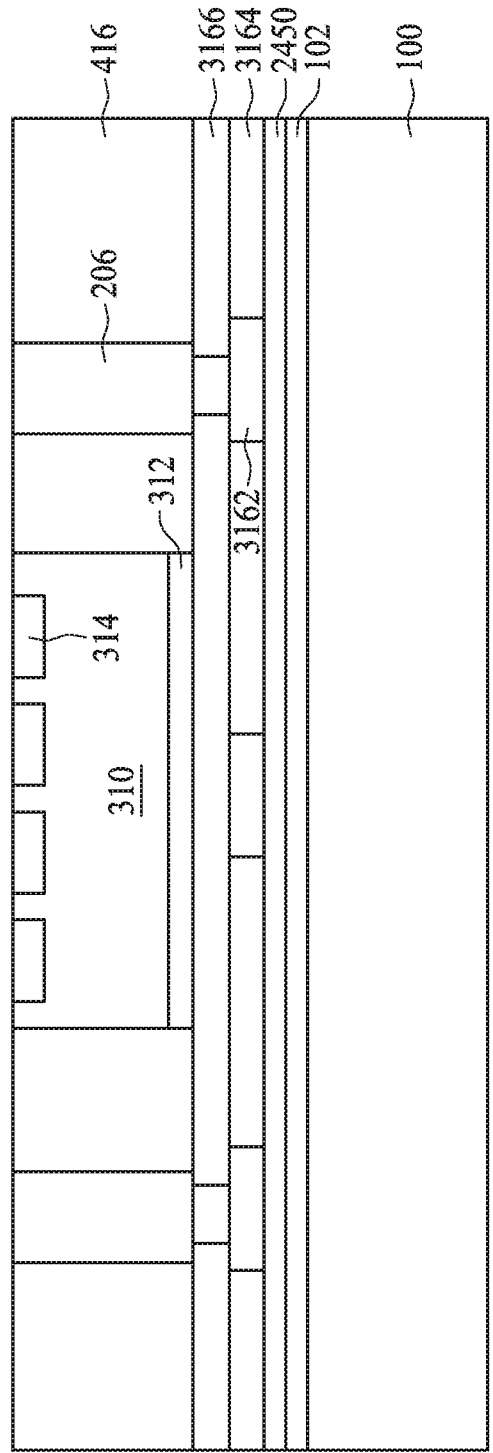
Figure 37:
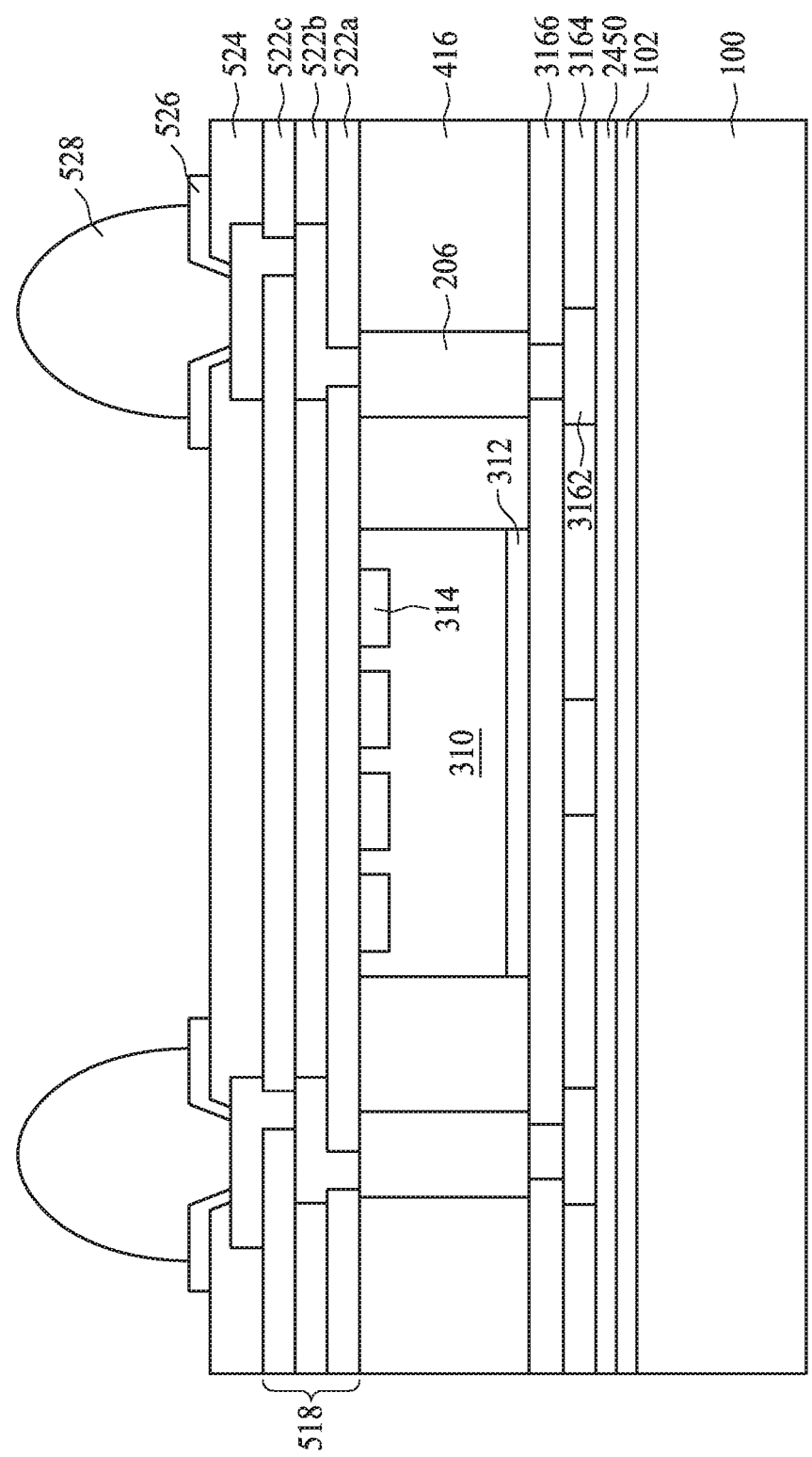
Figure 38:
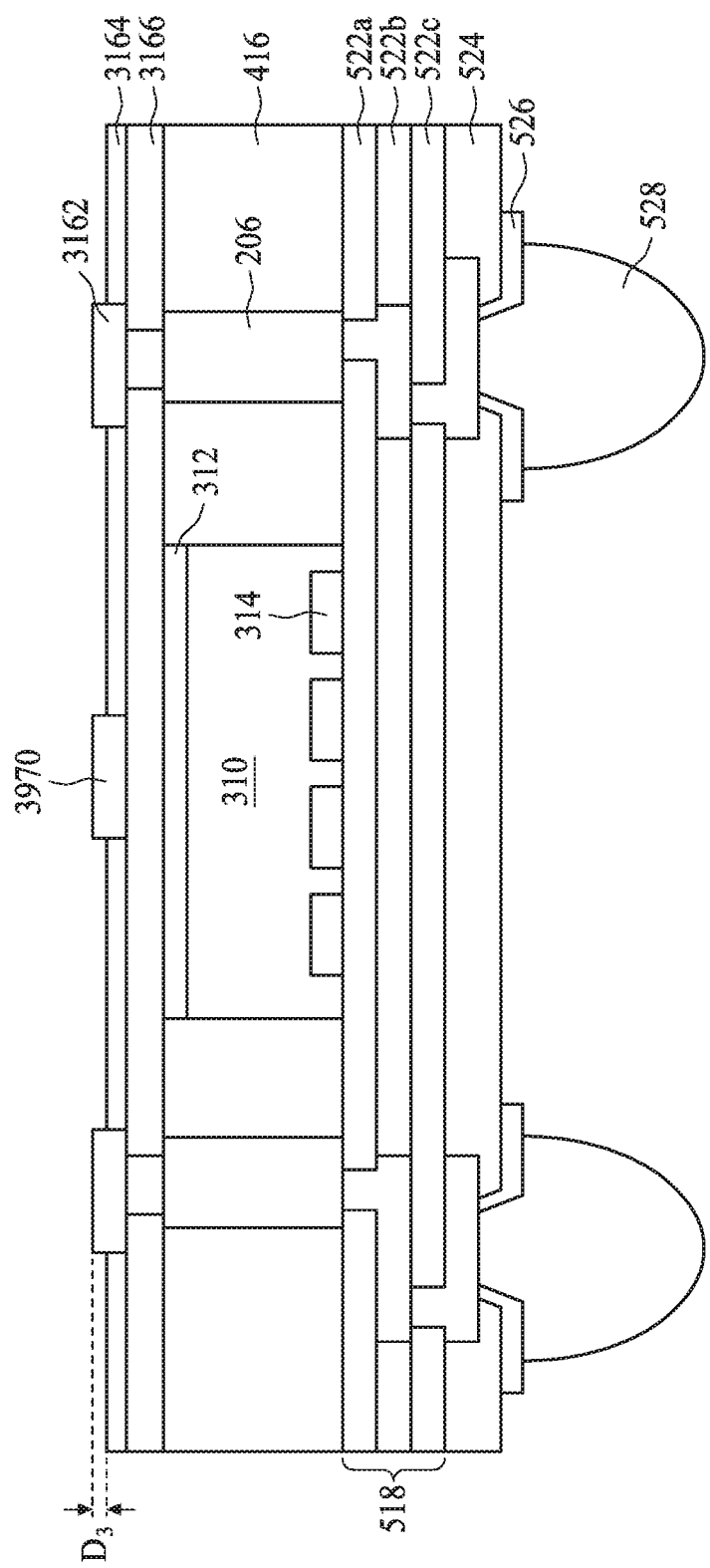

FIG. 33 illustrates a backside redistribution structure 3160 including a first backside metallization layer 3162 formed in a first backside dielectric layer 3164 and a second backside dielectric layer 3166. The backside redistribution structure 3160 may be formed using similar processes and materials as those used to form the front-side redistribution structure 518 as discussed above with reference to FIG. 5.

FIGS. 34-40 illustrate similar processes as those discussed above with reference to FIGS. 25-31, respectively, wherein like reference numerals refer to like elements. After removing the carrier substrate 100 and the release layer 102, the sacrificial backside dielectric layer 2450 may be removed. In some embodiments, the sacrificial backside dielectric layer 2450 is formed of a similar material as the first backside dielectric layer 3164 and is removed in a manner similar to the backside dielectric layer 104 as discussed above with reference to FIG. 29. For example, the removal of the sacrificial backside dielectric layer 2450 may be performed using a dry etch process using, for example, Ar, $N_2$, $CF_4$, $O_2$, or the like. The removal process may be controlled to over etch such that the first backside dielectric layer 3164 is recessed below a surface of the first backside metallization layer 3162 such that at least a portion of the sidewalls of the first backside metallization layer 3162 are exposed.

In some embodiments, the first backside dielectric layer 3164 is recessed by depth D3 of equal to or greater than 2 µm. By recessing the first backside dielectric layer 3164 and exposing sidewalls of the first backside metallization layer 3162 by a distance such as D2, backside connectors 830 (e.g., solder) subsequently formed over the first backside metallization layer 3162 may extend along the sidewalls of the first backside metallization layer 3162, increasing the contact surface area. In some embodiments, this increased contact surface between the solder and the first backside metallization layer 3162 may increase the reliability.

Figure 39:
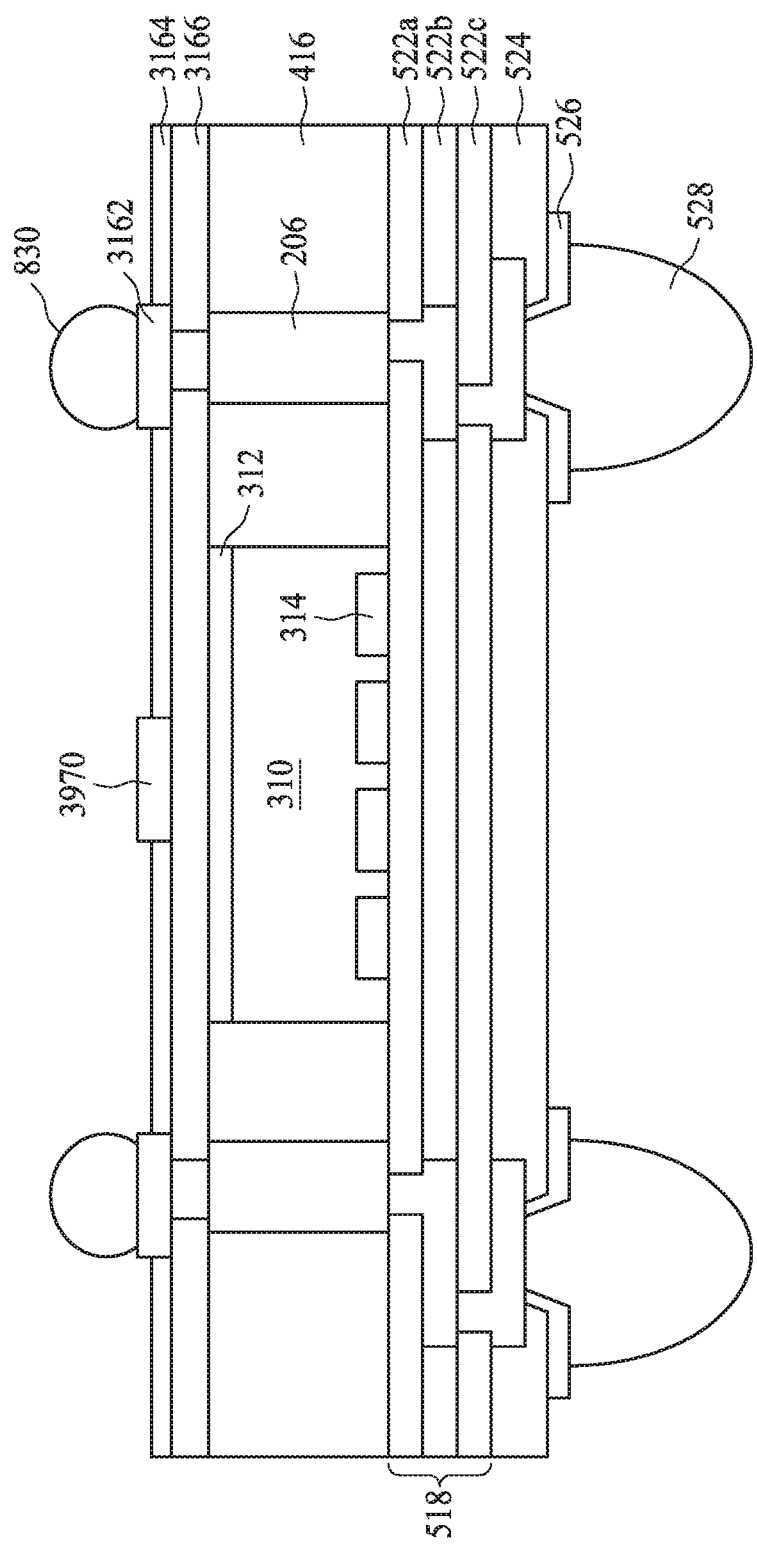
Figure 40:
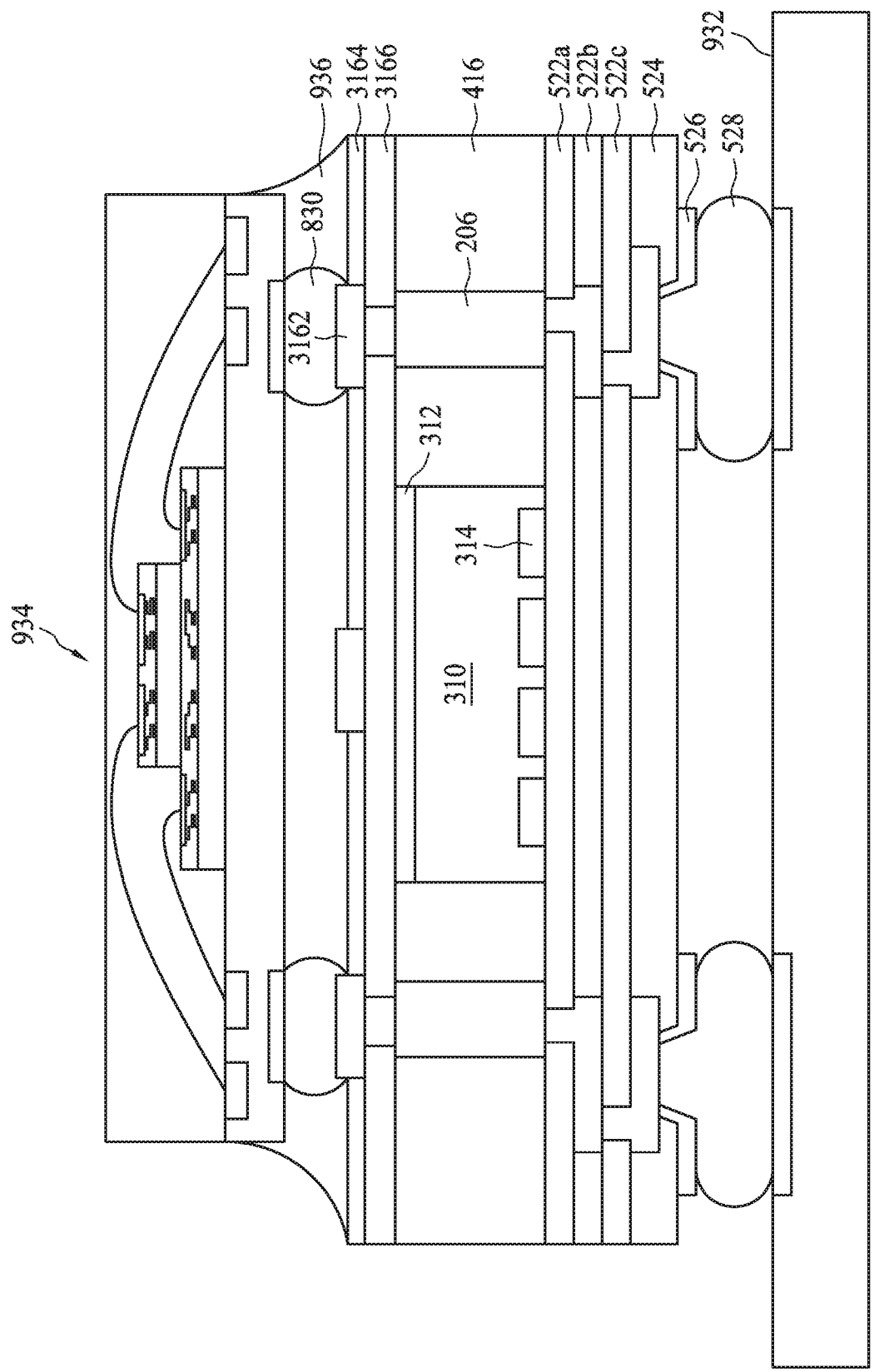

Thereafter, as illustrated in FIGS. 39 and 40, processes similar to those discussed above with reference to FIGS. 30 and 31, respectively, may be performed to form the backside connectors 830, attach the structure to other substrates (e.g., the first substrate 932 and/or the second substrate 934), and forming a molding underfill 936. As illustrated in FIG. 40, the backside connectors 830 sit directly on and extend along sidewalls of the first backside metallization layer 3162 in some embodiments.

FIGS. 39 and 40 also illustrates that one or more of the traces, such as trace 3970 may also be exposed. The trace 3970 represents a trace (e.g., a trace running into and out of the page) formed in the first backside metallization layer 3162 and may connect to one or more of the backside connectors. As illustrated in FIG. 40, exposed portions of the trace 3570 may be covered with molding underfill 936, protecting the trace 3970 from the external environment. In some embodiments, the molding underfill 936 may not extend along sidewalls of the second substrate 934. Though not shown, a molding underfill may also be formed between the first substrate 932 and passivation layer 524, surrounding the front-side connectors.

In some embodiments, a method of manufacturing a semiconductor device is provided. The method includes forming a first layer over a carrier substrate and forming a through via on the first layer. An integrated circuit die is placed over the first layer, and a molding compound is formed over the first layer such that the molding compound extends along sidewalls of the integrated circuit die and the through via. After removing the carrier substrate, the first layer is completely removed.

In some embodiments, a method of manufacturing a semiconductor device is provided. The method includes forming a first layer over a carrier substrate, the first layer having an opening, and forming a through via on the first layer, the through via extending into the opening. An integrated circuit die is placed over the first layer, and a molding compound is formed over the first layer, the molding compound extending along sidewalls of the integrated circuit die and the through via. A redistribution layer is formed over the integrated circuit die and the through vias. After removing the carrier substrate, the first layer is exposed and recessed such that the through via protrudes from first layer.

In some embodiments, a semiconductor device is provided. The semiconductor device includes an integrated circuit die having a front-side and a backside. Molding compound is adjacent sidewalls of the integrated circuit die. A first layer extends over the molding compound, the through via having a through via projection extending through the first layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
  a first package comprising:
    an integrated circuit die;
    molding compound disposed around the integrated circuit die;
    an adhesive over a backside of the integrated circuit die, wherein a sidewall of the adhesive extends above a top surface of the molding compound; and
    a through via extending through the molding compound and extending above the top surface of the molding compound;
  a second package over the first package; and
  a solder connection bonding the second package to the through via, the solder connection directly contacting an upper surface and sidewalls of the through via.

2. The semiconductor device of claim 1 further comprising an underfill interposed between the first package and the second package, wherein the underfill contacts the adhesive.

3. The semiconductor device of claim 2, wherein the underfill contacts an upper surface of the adhesive and a sidewall of the adhesive.

4. The semiconductor device of claim 2, wherein the underfill contacts a sidewall of the second package.

5. The semiconductor device of claim 1, wherein a bottom surface of the through via is level with a bottom surface of the molding compound.

6. The semiconductor device of claim 1, wherein an entirety of sidewalls of the integrated circuit die are covered by the molding compound.

7. The semiconductor device of claim 1, wherein the molding compound covers an interface between the integrated circuit die and the adhesive.

8. A semiconductor device comprising:
  an integrated circuit die, the integrated circuit die having a front-side and a backside;
  molding compound adjacent sidewalls of the integrated circuit die;
  a first layer extending over the molding compound;
  an adhesive material interposed between the integrated circuit die and the first layer; and
  a through via extending through the molding compound and the first layer, a smallest width of the through via in the molding compound being greater than a largest width of the through via in the first layer, wherein the through via protrudes from the first layer.

9. The semiconductor device of claim 8 further comprising an upper substrate electrically coupled to the through via by a solder connection.

10. The semiconductor device of claim 9, wherein the solder connection extends along sidewalls of the through via.

11. The semiconductor device of claim 10, wherein the solder connection directly contacts the first layer.

12. The semiconductor device of claim 9 further comprising an underfill, wherein the underfill directly contacts the upper substrate and the first layer.

13. The semiconductor device of claim 8 further comprising a redistribution structure directly coupled to the integrated circuit die, wherein the integrated circuit die is interposed between the adhesive and the redistribution structure.

14. The semiconductor device of claim 8, wherein sidewalls of the through via extending through the first layer are non-linear with sidewalls of the through via extending through the molding compound.

15. A semiconductor device comprising:
  an integrated circuit die, the integrated circuit die having a front-side and a backside;
  an adhesive layer on a backside of the integrated circuit die;
  molding compound adjacent sidewalls of the integrated circuit die and the adhesive layer;
  a through via extending through the molding compound, an upper surface of the through via being level with an upper surface of the adhesive layer, an upper surface of the molding compound being recessed from the upper surface of the through via and the upper surface of the adhesive layer; and
  a solder material directly on the upper surface of the through via, the solder material directly on sidewalls of the through via.

16. The semiconductor device of claim 15 further comprising:
  a substrate coupled to the through via by the solder material; and
  an underfill interposed between the adhesive layer and the substrate, wherein the underfill directly contacts an upper surface of the adhesive layer.

17. The semiconductor device of claim 16, wherein the underfill directly contacts a sidewall of the adhesive layer.

18. The semiconductor device of claim 15, wherein a lower surface of the through via is level with a lower surface of the molding compound.

19. The semiconductor device of claim 15, wherein the molding compound completely covers sidewalls of the integrated circuit die.

20. The semiconductor device of claim 15 further comprising a redistribution structure, the redistribution structure comprising a metal line directly coupled to the integrated circuit die, wherein the integrated circuit die is interposed between the adhesive layer and the redistribution structure.

* * * * *